(12) United States Patent
Inoue et al.

(10) Patent No.: US 8,159,749 B2
(45) Date of Patent: Apr. 17, 2012

(54) ANTIREFLECTION COATING AND DISPLAY DEVICE

(75) Inventors: Kazunori Inoue, Tokyo (JP); Naoki Tsumura, Kumamoto (JP); Nobuaki Ishiga, Kumamoto (JP); Takeshi Ono, Tokyo (JP); Naoki Nakagawa, Tokyo (JP); Masafumi Agari, Tokyo (JP); Yusuke Yamagata, Tokyo (JP); Kensuke Nagayama, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 315 days.

(21) Appl. No.: 12/545,217

(22) Filed: Aug. 21, 2009

(65) Prior Publication Data

US 2010/0053759 A1 Mar. 4, 2010

(30) Foreign Application Priority Data

Aug. 26, 2008 (JP) ................................ 2008-216374
Feb. 5, 2009 (JP) ................................ 2009-024700

(51) Int. Cl.
*G02B 5/28* (2006.01)
*G02F 1/1335* (2006.01)

(52) U.S. Cl. ........................ 359/589; 349/137

(58) Field of Classification Search .................. 359/581, 359/586–589; 349/137
See application file for complete search history.

(56) References Cited

U.S. PATENT DOCUMENTS

| | | | |
|---|---|---|---|
| 6,340,529 B1 | 1/2002 | Ebisawa et al. | |
| 6,768,581 B1 * | 7/2004 | Yip et al. | 359/355 |
| 2002/0022134 A1 * | 2/2002 | Fujino et al. | 428/432 |
| 2006/0192481 A1 | 8/2006 | Nagayama et al. | |
| 2007/0030569 A1 * | 2/2007 | Lu et al. | 359/586 |
| 2008/0165315 A1 * | 7/2008 | Nishida et al. | 349/137 |

FOREIGN PATENT DOCUMENTS

| | | |
|---|---|---|
| JP | 5-303005 | 11/1993 |
| JP | 7-263447 | 10/1995 |
| JP | 9-101404 | 4/1997 |
| JP | 9-252001 | 9/1997 |
| JP | 10-64909 | 3/1998 |
| JP | 10-333137 | 12/1998 |
| JP | 11-52126 | 2/1999 |
| JP | 2000-229379 | 8/2000 |
| JP | 2001-311812 | 11/2001 |
| JP | 2006-236839 | 9/2006 |
| WO | WO00/48204 | 8/2000 |

* cited by examiner

*Primary Examiner* — Stephone Allen
*Assistant Examiner* — Kimberly N Kakalec
(74) *Attorney, Agent, or Firm* — Oblon, Spivak, McClelland, Maier & Neustadt, L.L.P.

(57) ABSTRACT

An antireflection coating is formed on a transparent substrate and includes an Al film having a transmittance of lower than 10% at a wavelength of 550 nm with a thickness of 25 nm and predominantly composed of aluminum (Al), and an Al—N film formed in at least one of an upper layer and a lower layer of the Al film, having a transmittance of equal to or higher than 10% at a wavelength of 550 nm with a thickness of 25 nm, predominantly composed of Al and at least containing a nitrogen (N) element as an additive. A specific resistance of the antireflection coating is equal to or lower than $1.0 \times 10^{-2}$ $\Omega \cdot cm$, and a reflectance of a surface of the Al—N film is equal to or lower than 50% in a visible light region.

16 Claims, 23 Drawing Sheets

N COMPOSITION RATIO IN $Al_{100-x}N_x$ FILM (at%)

ANTIREFLECTION COATING AND DISPLAY DEVICE

BACKGROUND OF THE INVENTION

1. Field of the Invention

The present invention relates to an antireflection coating, and also relates to a display device including the antireflection coating.

2. Description of the Related Art

In a display device that uses an electrooptical device such as a liquid crystal or an electroluminescence (EL) device, an antireflection coating having a low reflectance and high light blocking property in a visible light region is generally placed between respective pixels. For example, in a color liquid crystal display panel, an antireflection coating that divides three primary color (i.e. Red, Green and Blue) filter patterns is placed on a transparent substrate such as glass. It is thereby possible to prevent mixture of colors or interference between the adjacent three primary color filter patterns. Further, by blocking light in a display light degradation area at the end of liquid crystal pixels, it is possible to increase the contrast of a display image and achieve a higher quality image. In order to satisfy the above characteristics, the antireflection coating should be such that a highly accurate pattern can be obtained easily and reflection of light at least from a display surface is low.

As such an antireflection coating, a Cr film having a low reflectance or a Cr alloy film predominantly composed of Cr (with a reflectance of about 60% at a wavelength of 550 nm) has been used. Further, a Cr (upper layer)/$CrO_y$ (lower layer) laminated film in which a thin film of Cr oxide ($CrO_y$) (y is a positive number; which is the same below) and a Cr film are sequentially laminated and which has low reflection characteristics (with a reflectance of 10% or lower at a wavelength of 550 nm) with use of an optical interference effect in the $CrO_y$ thin film has been used. The Cr film or the Cr/$CrO_y$ laminated film can be patterned easily and highly accurately by general photolithography and wet etching using a drug solution.

However, if hazardous hexavalent Cr ion is contained in a waste liquid that contains Cr ion generated in the process of wet etching, an increase in cost for the process of processing the hazardous waste is inevitable, and an alternative technique has been desired in terms of environmental issues.

In order to address the above concern, an antireflection coating that does not contain Cr has been proposed. For example, an antireflection coating made of an Fe/$FeO_y$ laminated film is proposed in Japanese Unexamined Patent Application Publication No. 09-101404, an antireflection coating made of a Ni—W—Zr/Ni—W—Zr—Oy laminated film is proposed in Japanese Unexamined Patent Application Publication No. 10-333137, and an antireflection coating made of a Ti—Mo—Ni film is proposed in Japanese Unexamined Patent Application Publication No. 2001-311812. Further, an antireflection coating having a laminated structure of a first layer made of oxide, nitride or oxynitride of an alloy of Ni and Ti, Zr, Nb, Ta, Si, W or Mo and a second layer made of an alloy, nitride or carbide of Ni and Ti, Zr, Nb, Ta or Si is proposed in Japanese Unexamined Patent Application Publication No. 11-52126. Furthermore, an example of using a lamination of a low refractive index film and a conductive nitride film having a high heat resistance that is predominantly composed of a metal selected from Ti and/or Zr and further contains at least one kind of metal selected from a group of Al, Mo, Cr, Nb, Hf, Ni, Co, Fe, Pd, Ag, Au and Pt as an antireflection coating is disclosed in International Patent Publication No. WO00/48204.

Further, a structure in which an aluminum nitride film is formed on the surface of an Al alloy line formed on a semiconductor substrate is disclosed as a structure having an antireflection function for light with a wavelength of 200 nm or less, though it is an example of a semiconductor device, in Japanese Unexamined Patent Application Publication No. 10-64909. Further, as another example of a semiconductor device, a structure in which an AlN coating layer made of a stoichiometric $Al_{50}N_{50}$ film is laminated on Al or Al alloy formed on a semiconductor substrate is disclosed as a structure having an antireflection function, an etching stopper function and an Al or Al alloy protection function in Japanese Unexamined Patent Application Publication No. 09-252001. Furthermore, an example in which a structure composed of a glass base, a bottom antireflection layer, a heat ray reflection layer and a top antireflection layer and using an AlN layer of a substantially stoichiometric composition as the bottom antireflection layer is used as an example of a glass lamination that can be applied to a sunlight control filter is disclosed in Japanese Unexamined Patent Application Publication No. 2000-229379.

SUMMARY OF THE INVENTION

In environmental terms, it is preferred to manufacture an antireflection coating by a process that does not emit hazardous hexavalent Cr ion as described earlier. In addition, it is a very important to reduce costs. For this purpose, it is important not to use rare metal such as Ti, Zr, Mo, W and Ni as a base. Further, in terms of maintaining the stability of long-period supply of a material as well, a technique of using a more general purpose material rather than rare metal as a base is desired. Particularly, it is preferred to use a material that can be used also as a material generally applied to wiring or electrodes in terms of material management.

In view of the foregoing, it is desirable to provide an antireflection coating that has both low reflection characteristics in a visible light region and low electrical resistance characteristics and enables cost reduction and environmental load reduction.

According to a first aspect of an embodiment of the present invention, there is provided an antireflection coating formed on a transparent substrate, which includes an Al film having a transmittance of lower than 10% at a wavelength of 550 nm with a thickness of 25 nm, the Al film predominantly composed of aluminum (Al), and an Al—N film formed in at least one of an upper layer and a lower layer of the Al film and having a transmittance of equal to or higher than 10% at a wavelength of 550 nm with a thickness of 25 nm, the Al—N film predominantly composed of Al and at least containing a nitrogen (N) element as an additive, wherein a specific resistance is equal to or lower than $1.0 \times 10^{-2}$ O·cm, and a reflectance of a surface of the Al—N film is equal to or lower than 50% in a visible light region.

According to a second aspect of an embodiment of the present invention, there is provided an antireflection coating formed on a transparent substrate, which is predominantly composed of aluminum (Al) and at least contains a nitrogen (N) element as an additive, wherein a composition ratio of the N-element is equal to or higher than 30 at %, and a specific resistance is equal to or lower than $1.0 \times 10^{-2}$ O·cm.

According to the embodiments of the present invention described above, it is possible to provide an antireflection coating that has both low reflection characteristics in a visible light region and low electrical resistance characteristics and enables cost reduction and environmental load reduction.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Exemplary embodiments of the present invention where an antireflection coating is applied are described hereinafter.

Embodiment 1

Figure 1:
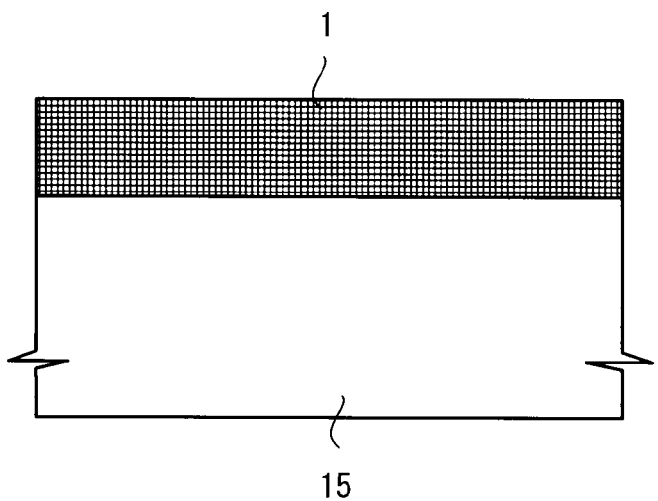
FIG. 1 is a schematic cross-sectional view of an antireflection coating according to a first embodiment of the present invention.

FIG. 1 is a schematic cross-sectional view of an antireflection coating 1 according to a first embodiment of the present invention. As shown in FIG. 1, the antireflection coating 1 is formed on a glass substrate 15, which is a transparent substrate. Although FIG. 1 shows an example in which the antireflection coating 1 according to the first embodiment is formed immediately above the glass substrate 15, another film may be placed between the glass substrate 15 and the antireflection coating 1. The antireflection coating 1 according to the first embodiment has a single layer structure.

The antireflection coating 1 is an Al—N film that is predominantly composed of aluminum (Al) and at least contains nitrogen (N) as an additive. Further, metal other than Al may be added, so that the antireflection coating 1 is a metal compound made of an intermetallic compound composed of two or more kinds of metal or an alloy compound containing another state of metal such as an alloy. The additive may be selected appropriately according to use or needed performance (e.g. heat resistance, corrosion resistance etc.) without departing from the scope of the invention. If a group 8 transition metal element (more preferably, at least one kind of element selected from Fe, Ni and Co) is added to Al, contact characteristics with a transparent conductive oxide film such as ITO, which has been difficult, becomes suitable. Therefore, if at least one kind of element selected from Fe, Ni and Co as a group 8 transition metal element is added to Al, it is suitable for use as a black matrix for a color filter substrate of a liquid crystal display device which is electrically connected to a transparent conductive film such as ITO. It is preferred that the total amount of element added to Al, other than an N-element, does not exceed 15 at % in order to suppress an increase in specific resistance.

The antireflection coating 1 is electrically conductive. Specifically, the specific resistance of the antireflection coating 1 is set to be equal to or smaller than $1 \times 10^{-2}$ O·cm (equal to or smaller than 10,000 µO cm), which is a practical conductive region. In the case of using an Al—N film as the antireflection coating 1, if it is an $Al_{50}N_{50}$ film with a stoichiometric composition of 1:1, the specific resistance is at least 10 O·cm, which is outside the conductive region. Thus, the antireflection coating 1 is formed not to be an $Al_{50}N_{50}$ film with a stoichiometric composition of 1:1. In the following description, an Al—N film is also referred to as an "$Al_{100-x}N_x$ film" where x(at %) is a value larger than 0 and smaller than 50.

An example of a manufacturing method of the antireflection coating 1 is described hereinafter. According to the first embodiment, the antireflection coating 1 is deposited on the glass substrate 15, which is a transparent insulating substrate. The deposition of the antireflection coating 1 can be performed by a known technique such as coating, vapor deposition or sputtering. Particularly, sputtering is a widely used thin film formation technique, and it is preferable for formation of the antireflection coating 1 according to the first embodiment. In the first embodiment, the antireflection coating 1 made of an Al nitride film to which an N-element is added ($Al_{100-x}N_x$) is deposited with a thickness of 200 nm by sputtering. Specifically, the antireflection coating 1 is formed by reactive sputtering with use of a metal target of pure Al as a target of sputtering and use of mixed gas in which nitrogen ($N_2$) gas is added to argon (Ar) gas. In this method, it is possible to easily change the N composition ratio in the $Al_{100-x}N_x$ film by changing the amount of $N_2$ gas added to Ar gas.

The relationship of the N composition ratio in the $Al_{100-x}N_x$ film that constitutes the antireflection coating 1 with respect to the amount of $N_2$ gas in mixed gas differs depending on a parameter such as the volume, the input power or the sputtering gas pressure of a sputtering device. Thus, conditions are optimized according to a sputtering device to use. The amount of $N_2$ gas added to Ar gas is preferably less than 50% and more preferably less than 40% in a voltage division ratio. This is because, if the amount of $N_2$ gas added to Ar gas becomes 50% in a voltage division ratio, the above-described $Al_{50}N_{50}$ film with a stoichiometric composition of 1:1 is formed. It is therefore preferred that the amount of $N_2$ gas added to Ar gas is less than 50% in a voltage division ratio.

As sputtering gas, inert gas such as Kr gas may be used instead of Ar gas. The inert gas may be used by itself or by being mixed. The inert gas indicates gas that does not affect the composition of a film to be deposited. Further, sputtering may be performed by using a target to which an N-element is added in advance in stead of performing reactive sputtering. In this case, it is not necessary to add $N_2$ to sputtering gas, and pure Ar, pure Kr gas or the like may be used as it is.

Figure 2:
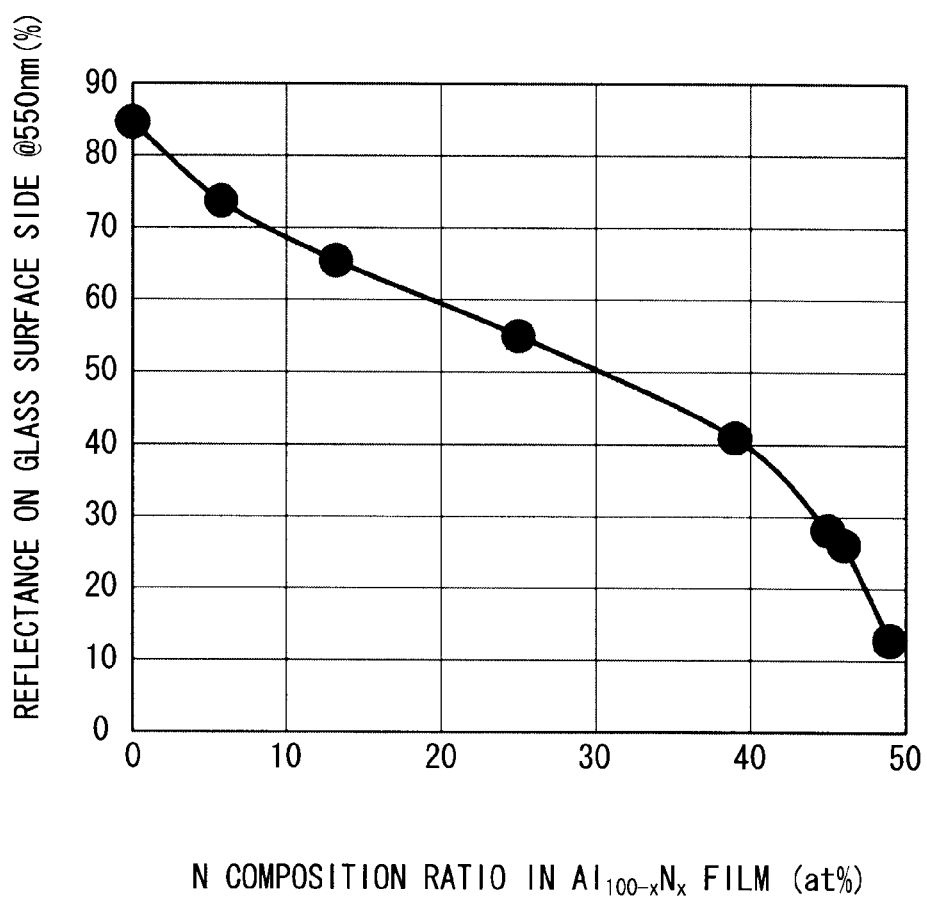
FIG. 2 is a view plotting a reflectance with respect to an N composition ratio (at %) in an $Al_{100-x}N_x$ film.

FIG. 2 is a view plotting a reflectance with respect to a composition ratio (at %) of an N-element in an $Al_{100-x}N_x$ film (which is hereinafter referred to simply as an N composition ratio). The reflectance is measured at a wavelength of 550 nm and indicates a value measured from the glass substrate 15 side. Hereinafter, a measurement wavelength of a reflectance is 550 nm and the reflectance is measured from the glass substrate 15 side unless otherwise noted. In the case where antireflection of an upper film surface, which is an interface with air on the opposite side from the glass substrate, is required, a reflectance from the upper film surface is practically important. However, a reflectance measured from the upper film surface side is affected by the roughness of a film surface by sputtering conditions and a reflection dissipation component due to a difference in an irregular shape in addition to an original reflectance of film properties. Therefore, in this description, a result of measuring a reflectance from the glass substrate 15 side is mainly studied. The glass substrate 15 with an optical constant n (refractive index) of 1.5 (at 550 nm) and with a thickness of 0.6 mm was used.

FIG. 2 shows that the reflectance of the $Al_{100-x}N_x$ film decreases in a monotone manner as the N composition ratio increases. It also shows that the reflectance becomes about 50% or lower when the N composition ratio reaches 30 at % or higher. This value is lower compared to the case of using a Cr film or an Mo film, which is an antireflection coating according to related art. Therefore, by setting the N composition ratio to be added to the antireflection coating 1 predominantly composed of Al to 30 at % or higher, it is possible to obtain low reflection characteristics that are more suitable than those of a Cr film or a Mo film.

Figure 3:
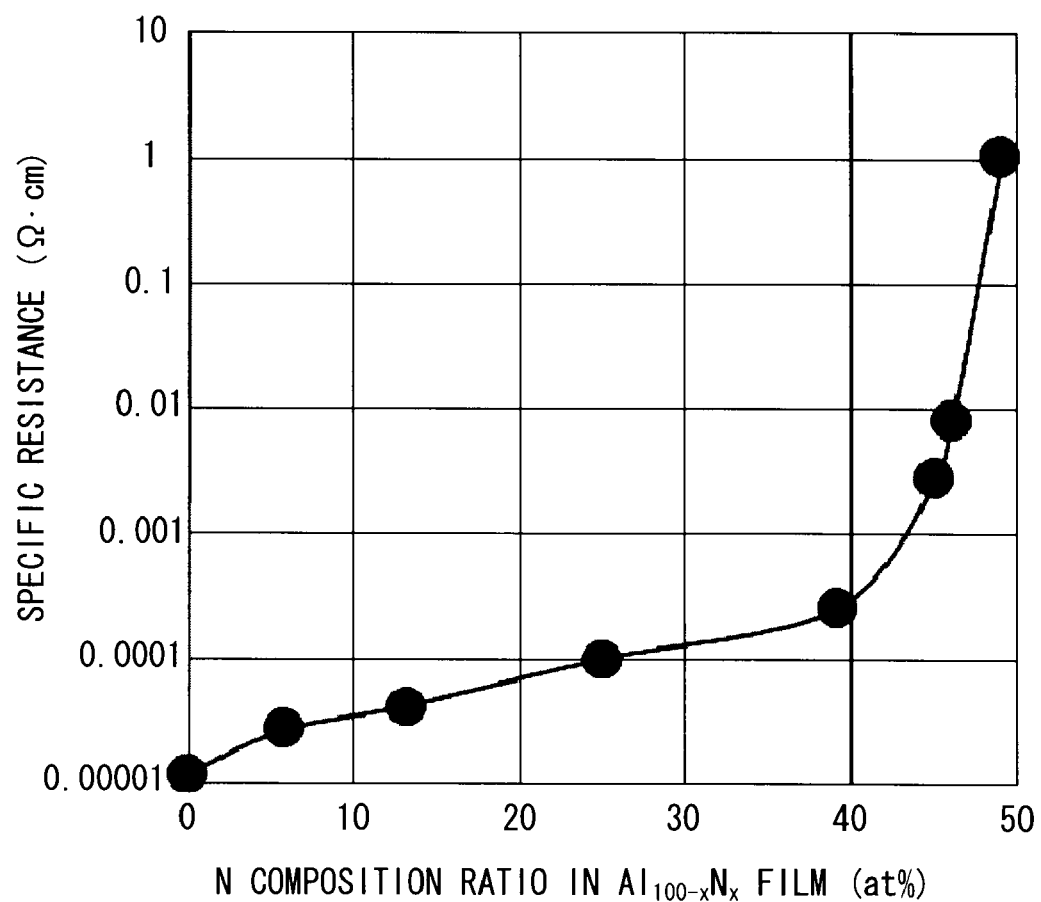
FIG. 3 is a view plotting a specific resistance (O·cm) with respect to an N composition ratio (at %) in an $Al_{100-x}N_x$ film.

FIG. 3 is a view plotting a specific resistance (O·cm) with respect to an N composition ratio (at %) in the $Al_{100-x}N_x$ film. FIG. 3 shows that the specific resistance of the $Al_{100-x}N_x$ film increases exponentially as the N composition ratio increases. In order to obtain a practical conductive region (equal to or lower than $1 \times 10^{-2}$ O·cm), it is preferred that the N composition ratio added to Al does not exceed 45 at %.

In the case where light blocking characteristics are required for the antireflection coating 1, such as when the antireflection coating 1 is applied to a black matrix of a color filter substrate or the like, it is preferred that the N composition ratio added to Al is equal to or lower than 45 at %. This is because a light transmitting property appears abruptly when the N composition ratio added to Al exceeds 40 at % and, particularly, 45 at %. For example, in the case of a thin film with a thickness of 200 nm, while the light transmittance (at a wavelength of 550 nm) of the $Al_{100-x}N_x$ film with an N composition ratio of 45 at % is about 1%, the light transmittance (at a wavelength of 550 nm) of the $Al_{100-x}N_x$ film with an N composition ratio of approximately 50 at % is as high as about 80%. This is the case of using the antireflection coating 1 having a single layer structure of the $Al_{100-x}N_x$ film, and the value differs if the antireflection coating 1 has a laminated structure including another film having good light blocking characteristics or if another additive is added. Further, because the light transmitting property varies depending on a film thickness, it is possible to adjust the light blocking characteristics by adjusting the film thickness.

By using the antireflection coating 1 with an N composition ratio in the $Al_{100-x}N_x$ film of equal to or higher than 30 at % and with a specific resistance of equal to or lower than $1 \times 10^{-2}$ O·cm having conductivity, it is possible to obtain an antireflection coating in a single layer structure having low reflection characteristics with a reflectance of approximately 50% or lower and conductive property.

Figure 4:
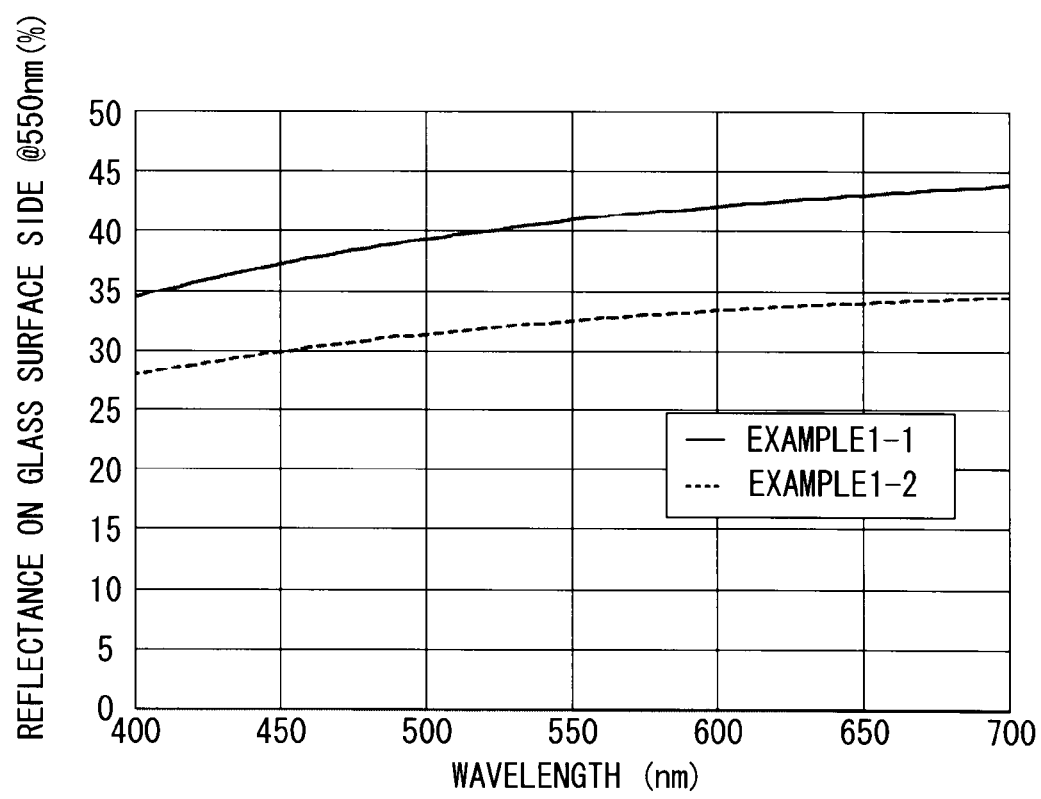
FIG. 4 is a view showing a light wavelength dependence of a reflectance in an $Al_{100-x}N_x$ film.

FIG. 4 is a view plotting a light wavelength dependence of a reflectance of an Al-39 at % N film with an N composition ratio of 39 at % (example 1-1) and an Al-45 at % N film with an N composition ratio of 45 at % (example 1-2) respectively as the antireflection coating 1. FIG. 4 shows that the reflectance of the antireflection coating 1 according to the example 1-1 and the example 1-2 is equal to or lower than 50% in any wavelength region (400 to 700 nm), thus having sufficiently low reflection characteristics in a visible light region.

Figure 5:
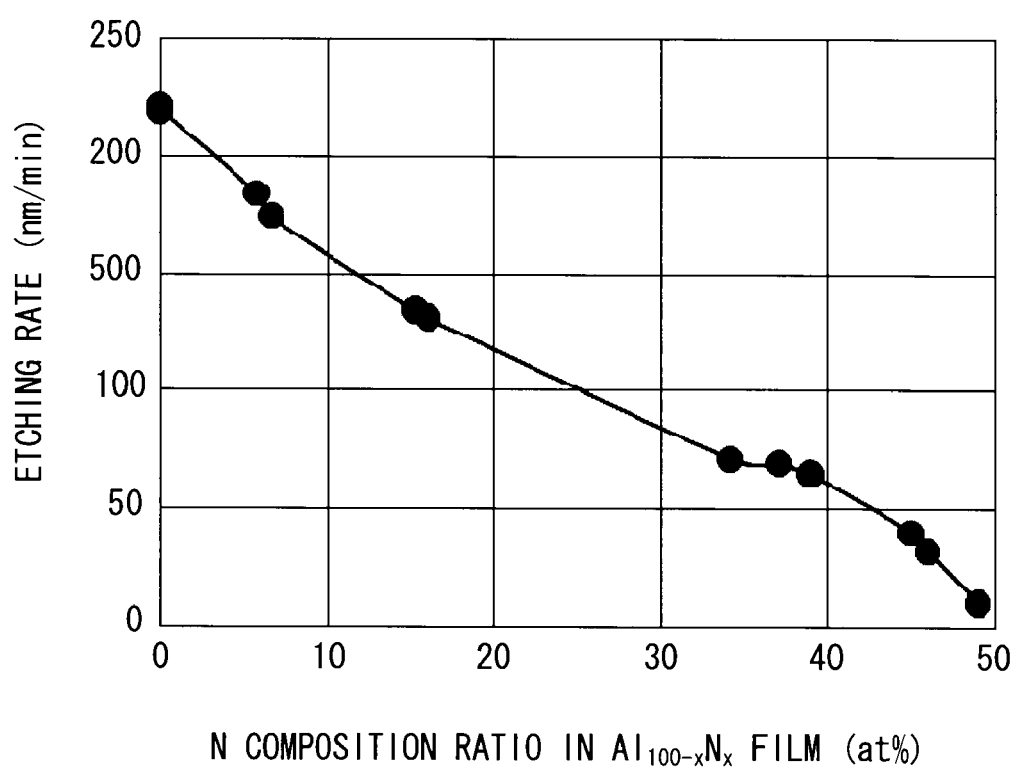
FIG. 5 is a view plotting an etching rate with respect to an N composition ratio (at %) in an $Al_{100-x}N_x$ film.

FIG. 5 is a view plotting an etching rate with respect to an N composition ratio (at %) in an $Al_{100-x}N_x$ film constituting the antireflection coating 1 when performing wet etching with use of a known drug solution (at a liquid temperature of 40° C.). FIG. 5 shows that the $Al_{100-x}N_x$ film with an N composition ratio of 30 at % to 45 at % can be patterned at an etching rate of about 40 to 70 nm/min. In the case of an $Al_{50}N_{50}$ film with an N composition ratio of 50 at % (an AlN film with a stoichiometric composition of 1:1), it is the outside the conductive region. Further, etching by the known wet etching becomes difficult, and it is thus necessary to perform etching by dry etching or the like. This causes an increase in processing cost.

Although the antireflection coating 1 according to the first embodiment is an $Al_{100-x}N_x$ film in the above example, it may be an $Al_{100-x-y}M_yN_x$ film to which another element M is further added. If at least one kind of element selected from a group 8 transition metal is added as the element M, it is possible to achieve suitable electrical contact with a transparent conductive oxide film such as ITO, which has been difficult heretofore. Particularly, if at least one kind of element selected from Fe, Co and Ni is added, it is possible to achieve more suitable electrical contact characteristics. This enables suitable use as a black matrix for a color filter substrate which is electrically connected to an electrode such as ITO. Although the effect of improving the contact characteristics can be obtained by addition of a small amount of the element M, it is preferred that the added amount y is 0.1 at % or larger in order to obtain a reliable effect. On the other hand, if the added amount y is too large, the grain of the element M is not etched in the above-described known wet etching process of the Al film and remains as a residual, which can cause a patterning defect. It is thus preferred that the added amount y does not exceed 15 at %.

Because the antireflection coating 1 according to the first embodiment contains Al metal as a base, patterning is easy and a highly accurate pattern can be obtained. Further, because a practical conductive region (equal to or lower than $1\times10^{-2}$ Ω·cm) is obtained, it is possible to obtain conductive characteristics. Furthermore, because the antireflection coating 1 contains an N-element with a composition ratio of 30 at % or higher, it is possible to achieve low reflection characteristics. It is thereby possible to achieve low reflection characteristics and conductive characteristics with use of a film that contains Al metal as a base. This eliminates the need to laminate a different group of metal, thus enabling cost reduction. Further, by adjusting the N composition ratio or the film thickness, it is possible to exhibit the light blocking property.

The manufacturing method of the antireflection coating 1 according to the first embodiment can employ a known technique such as reactive sputtering. It is thus possible to use an existing facility without need of a special manufacturing device. This enables cost reduction. Further, because the antireflection coating 1 according to the first embodiment has a single layer structure, the manufacturing process is simple. Furthermore, because those characteristics can be achieved without use of Cr, hazardous hexavalent Cr ion is not generated during the wet etching process. This eliminates the need for a process of processing the hazardous waste, thus enabling environmental load reduction. In addition, because the antireflection coating 1 according to the first embodiment contains general-purpose Al material, not rare metal, as a base, it is possible to enable cost reduction and stable long-period supply of a material.

The transparent substrate on which the antireflection coating is formed is not limited to a glass substrate, and various kinds of transparent substrates may be used without departing from the scope of the invention. For example, a transparent insulating substrate such as plastic like polycarbonate may be suitably used. Further, the substrate thickness and the optical constant in the above example are given by way of illustration only, and desired thickness and optical constant may be used as a matter of course. Furthermore, the antireflection coating according to an embodiment of the present invention is not limited to have a single layer structure, and it may have a laminated structure as described in the following embodiment. Further, a laminated film having another function (e.g. a film having a protection function) may be laminated within the range satisfying the features of the present invention.

Second Embodiment

An example of an antireflection coating that is different from the antireflection coating 1 according to the first embodiment is described hereinafter. In the following description, the same elements as in the first embodiment are denoted by the same reference symbols and the explanation thereof is omitted as appropriate.

The basic structure and the manufacturing method of an antireflection coating according to a second embodiment of the present invention are the same as those according to the above-described first embodiment except for the following point. Specifically, while the antireflection coating 1 according to the first embodiment has a single layer structure, an antireflection coating 2 according to the second embodiment has a laminated structure.

Figure 6:
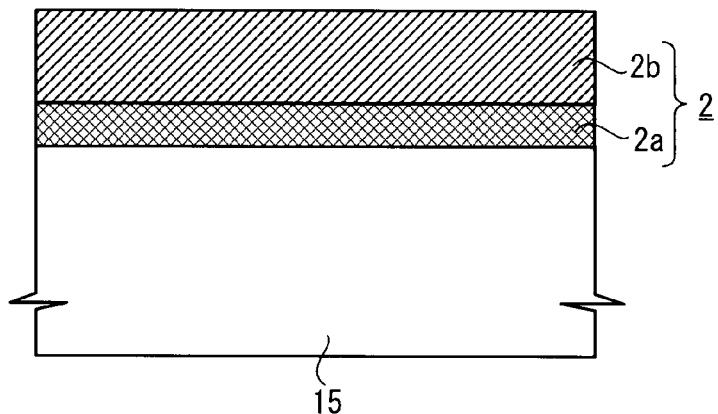
FIG. 6 is a schematic cross-sectional view of an antireflection coating according to a second embodiment of the present invention.

FIG. 6 is a schematic cross-sectional view of the antireflection coating 2 according to the second embodiment. As shown in FIG. 6, the antireflection coating 2 is formed on the glass substrate 15. The antireflection coating 2 has a two-layer structure, and an Al—N film 2a serving as a first thin film and an Al film 2b serving as a second thin film are laminated in this order on top of the glass substrate 15.

The Al—N film 2a is predominantly composed of Al and at least contains N-element as an additive and further has both conductive property and light transmitting property. The Al film 2b is predominantly composed of Al and has both light blocking property and conductive property. Further, metal other than Al may be added to each of the Al—N film 2a and the Al film 2b independently of each other, so that they are an intermetallic compound, an alloy or the like composed of two or more kinds of metal. Although it is necessary for the Al—N film 2a to contain an N-element, it is not required for the Al film 2b to contain an N-element. In other words, the Al film 2b may contain an N-element as long as it maintains light blocking property and conductive property.

The "film having light transmitting property" is defined to be a film having a transmittance of 10% or higher at a thickness of 25 nm. Thus, a film with a thickness of about 100 nm has a transmittance of at least several percent. On the other hand, the "film having light blocking property" is defined to be a film having a transmittance of less than 10% at a thickness of 25 nm. In the following description, a transmittance indicates a value at a thickness of 25 nm unless otherwise noted. It is known that light transmitting property generally appears in a metal thin film that does not originally have light transmitting property if the film thickness decreases significantly. For example, a transmittance of about 5% occurs in a pure Al film by setting a film thickness to about 5 nm.

Figure 7:
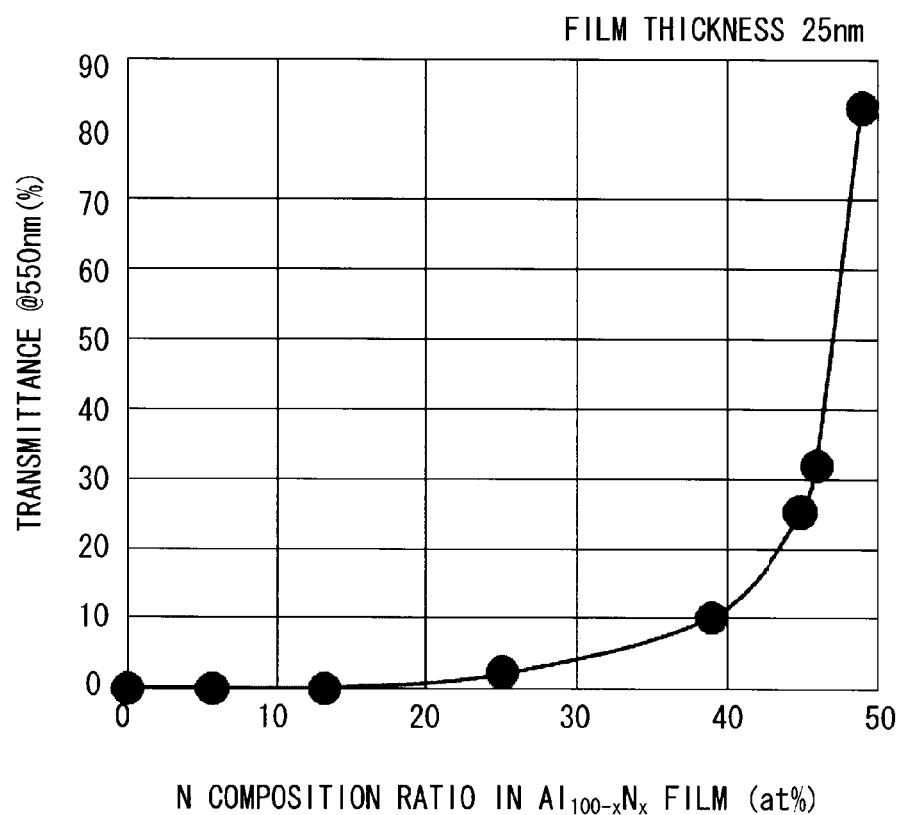
FIG. 7 is a view plotting a transmittance with respect to an N composition ratio (at %) in an $Al_{100-x}N_x$ film.

FIG. 7 is a view plotting a transmittance at a wavelength of 550 nm with respect to an N composition ratio (at %) in an $Al_{100-x}N_x$ film. The $Al_{100-x}N_x$ film was formed by sputtering with use of a metal target of pure Al and use of mixed gas in which $N_2$ gas is added to Ar gas as in the first embodiment. The respective $Al_{100-x}N_x$ films having different N composition ratios were deposited with a thickness of 25 nm. The transmittance shown in FIG. 7 is the transmittance of a film itself, not including the transmittance of the glass substrate 15, which is a transparent insulating substrate.

FIG. 7 shows that the transmittance of the $Al_{100-x}N_x$ film is such that light transmitting characteristics appear when the N composition ratio exceeds approximately 20 at %. It also shows that the transmittance becomes higher than 10% when the N composition ratio exceeds approximately 40 at % and reaches about 80% when the N composition ratio is approximately 48 at %. In other words, by setting the N composition ratio in the $Al_{100-x}N_x$ film to be 40 at % or higher, it is possible to exhibit the light transmitting property in the $Al_{100-x}N_x$ film. Of course, the light transmitting property varies according to addition of another additive or the like. Therefore, the film with the N composition ratio of less than 40 at % is not excluded based on this result.

The Al—N film 2a that serves as the first thin film of the antireflection coating 2 is a film having both light transmitting property and conductive property as described above. In the case of using the $Al_{100-x}N_x$ film as the Al—N film 2a, it is necessary to set the N composition ratio in the $Al_{100-x}N_x$ film to be higher than 40 at % so as to have the light transmitting property as shown in FIG. 7. The specific resistance (conductive property) with respect to the N composition ratio (at %) in the $Al_{100-x}N_x$ film is as shown in FIG. 3. Thus, if the $Al_{100-x}N_x$ film is used as the Al—N film 2a according to the second embodiment, a specific resistance is about $2.5 \times 10^{-4}$ O·cm (250 μO·cm) or higher in the region where the N composition ratio is 40 at % or higher.

Figure 8:
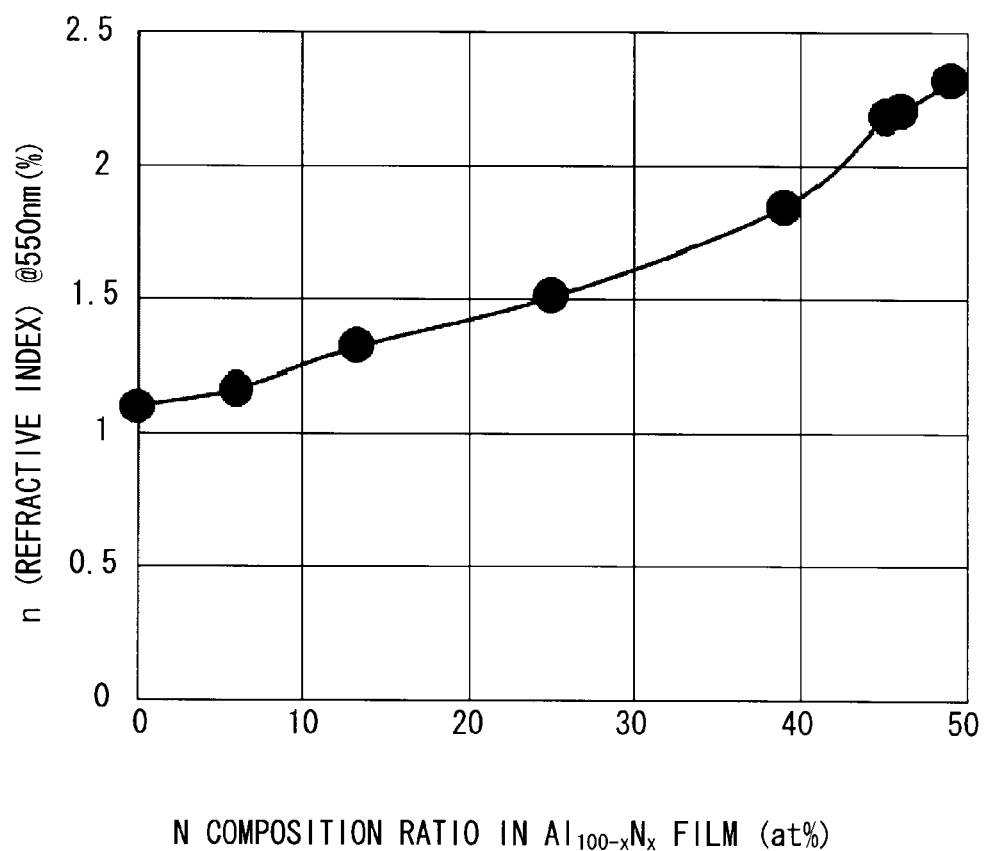
FIG. 8 is a view plotting n (refractive index) with respect to an N composition ratio (at %) in an $Al_{100-x}N_x$ film.
Figure 9:
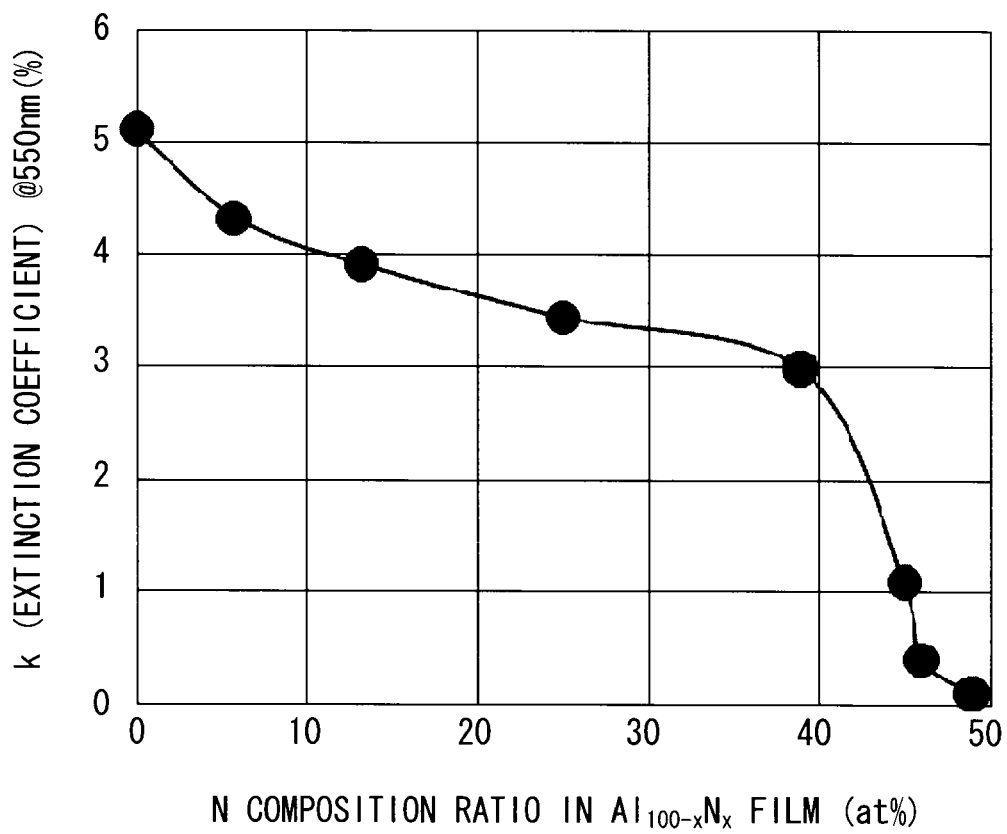
FIG. 9 is a view plotting k (extinction coefficient) with respect to an N composition ratio (at %) in an $Al_{100-x}N_x$ film.

FIG. 8 is a view plotting an optical constant n (refractive index) at a wavelength of 550 nm with respect to an N composition ratio (at %) in an $Al_{100-x}N_x$ film. FIG. 9 is a view plotting an optical constant k (extinction coefficient) at a wavelength of 550 nm with respect to an N composition ratio (at %) in an $Al_{100-x}N_x$ film.

FIG. 9 shows that the value k (extinction coefficient) decreases sharply when the N composition ratio in the $Al_{100-x}N_x$ film having light transmitting property exceeds approximately 40 at % and becomes about 3 or smaller. The decrease in k (extinction coefficient) corresponds to an increase in light transmitting property. Further, FIG. 8 shows that the value n (refractive index) indicates about 1.9 or larger in the region where the N composition ratio in the $Al_{100-x}N_x$ film having light transmitting property exceeds approximately 40 at %.

Figure 10:
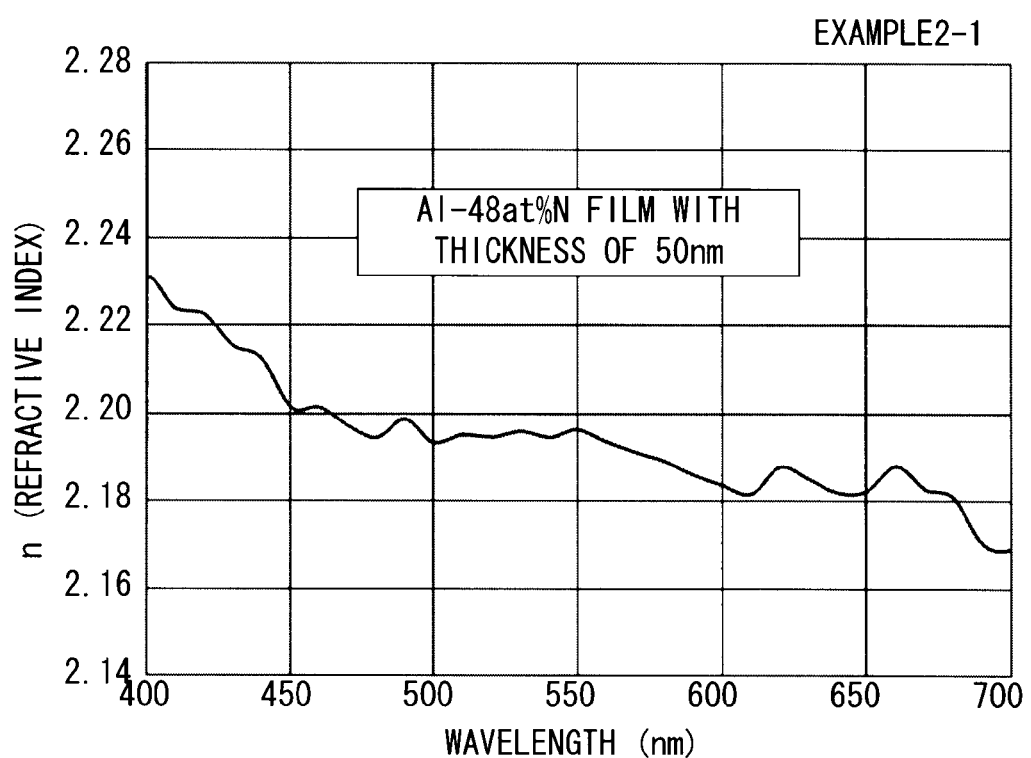
FIG. 10 is a view showing a wavelength dependence of n (refractive index) in an antireflection coating according to an example 2-1.

FIG. 10 is a view showing a wavelength dependence of n (refractive index) in an Al-48 at % N film with an N composition ratio of 48 at % and with a thickness of 50 nm as an example of the Al—N film 2a having light transmitting property which serves as the first thin film of the antireflection coating 2 (example 2-1). The transmittance of a sample in the example 2-1 was about 80%.

Figure 11:
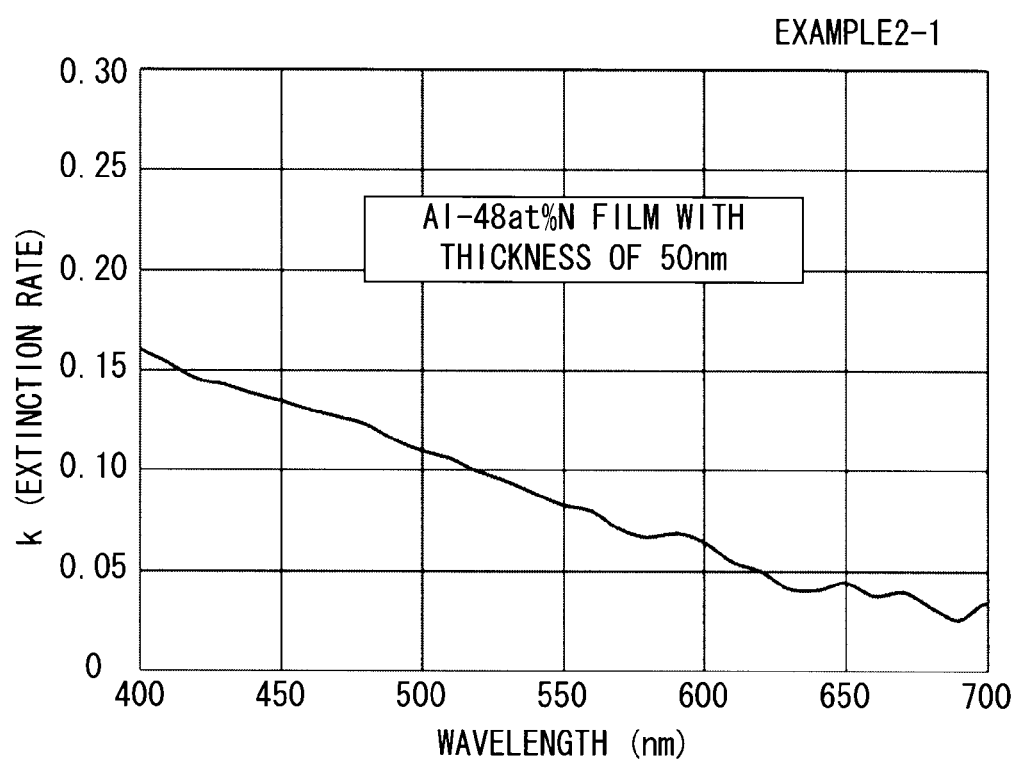
FIG. 11 is a view showing a wavelength dependence of k (extinction coefficient) in an antireflection coating according to the example 2-1.

FIG. 11 is a view showing a wavelength dependence of k (extinction coefficient) in the Al—N film 2a according to the example 2-1. FIGS. 10 and 11 show that n (refractive index) and k (extinction coefficient) have wavelength dependence. In the following description, the values of n (refractive index) and k (extinction coefficient) indicate values at a measurement wavelength of 550 nm unless otherwise noted.

Figure 12:
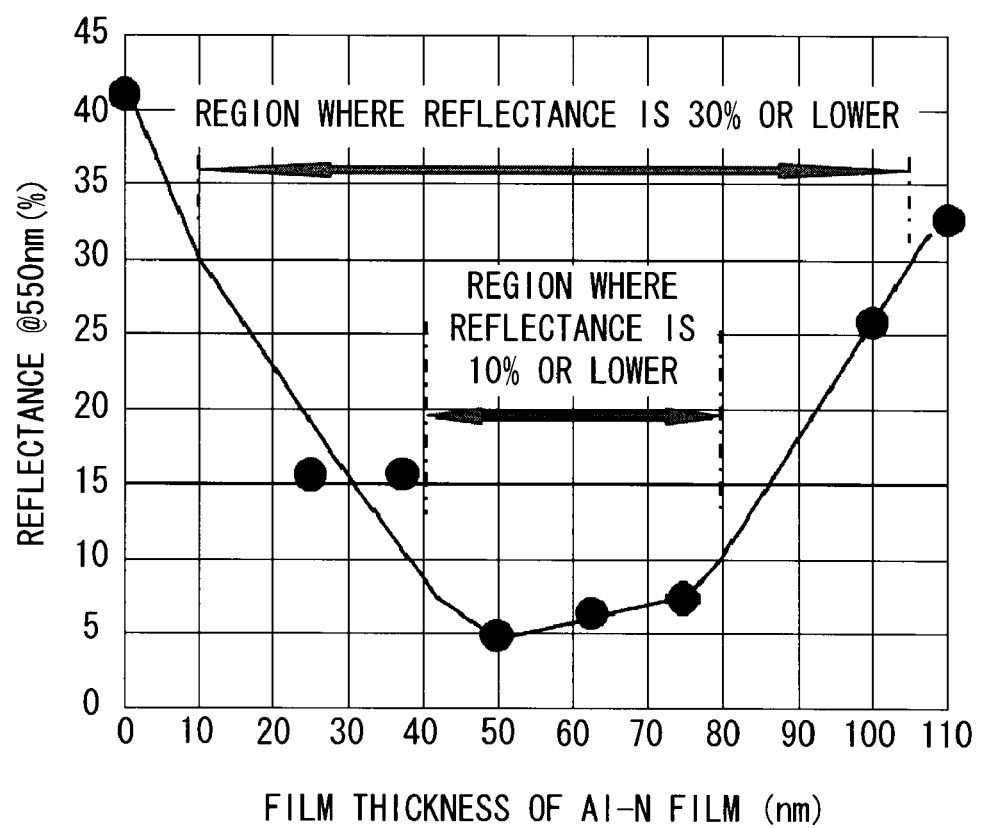
FIG. 12 is a view plotting a reflectance of an antireflection coating with respect to a film thickness of an Al—N film according to an example 2-2.

Hereinafter, a result of studying an optimum film thickness of the Al—N film 2a that serves as the first thin film of the antireflection coating 2 is described. FIG. 12 is a view plotting a reflectance of a laminated film having a laminated structure of an Al—N film serving as the first thin film 2a and an Al film serving as the second thin film 2b. A sample was obtained by depositing an $Al_{100-x}N_x$ film with a selected thickness on the transparent insulating glass substrate 15 (n=1.5) with a thickness of 0.6 mm and further depositing an Al film with a fixed thickness of 200 nm thereon.

In the sample of FIG. 12, an Al-48 at % N film with an N composition ratio of 48 at % which forms an $Al_{100-x}N_x$ film was used as the first thin film. The light transmittance of the first thin film was 80%, the specific resistance was 0.05 O·cm, n (refractive index) was 2.31, and k (extinction coefficient) was 0.083. Further, the film thickness of the first thin film varied from 110 nm at maximum to 0 nm at minimum (no first thin film). Further, as the second thin film, an Al-39 at % N film with an N composition ratio of 39 at % was deposited with a film thickness of 200 nm. The reflectance of the film was 41%, n (refractive index) was 1.84, and k (extinction coefficient) was 2.97.

The laminated films ware etched all together at a time with use of a known drug solution of phosphoric acid+nitric acid+acetic acid, as in the first embodiment.

FIG. 12 shows that a reflectance varies depending on the thickness of the first thin film. In the sample of FIG. 12, sufficiently low reflectance characteristics with a reflectance of 50% or lower are obtained in any film thickness region shown in the graph. If the thickness of the first thin film is limited to the range of 10 nm to 105 nm, a reflectance is 30% or lower. Further, if the thickness of the Al—N film 2a is limited to the range of 40 nm to 80 nm, a reflectance is 10% or lower. The Al—N film 2a where a reflectance is 10% or lower (with a thickness of 40 nm to 80 nm) was a so-called black film.

In the sample of FIG. 12, by limiting the thickness of the Al—N film 2a, which is the first thin film of the antireflection coating 2, within the range of 10 nm to 105 nm, it is possible to provide the antireflection coating 2 having lower reflectance characteristics than the antireflection coating 1 according to the first embodiment. The specific resistance of the antireflection coating 2 is determined by a film having the lower specific resistance in the laminated film. Thus, the specific resistance of the sample of FIG. 12 is determined by the specific resistance of the Al film 2b. Specifically, the specific resistance was $2.5 \times 10^{-4}$ O·cm, thus having suitable conductive property.

Although the range where a reflectance is 50% or lower, 30% or lower or 10% or lower is described in the foregoing, a required reflectance varies according to use or needed performance of an antireflection coating. Thus, the film may be determined so as to satisfy a desired reflectance according to use or needed performance.

Figure 13:
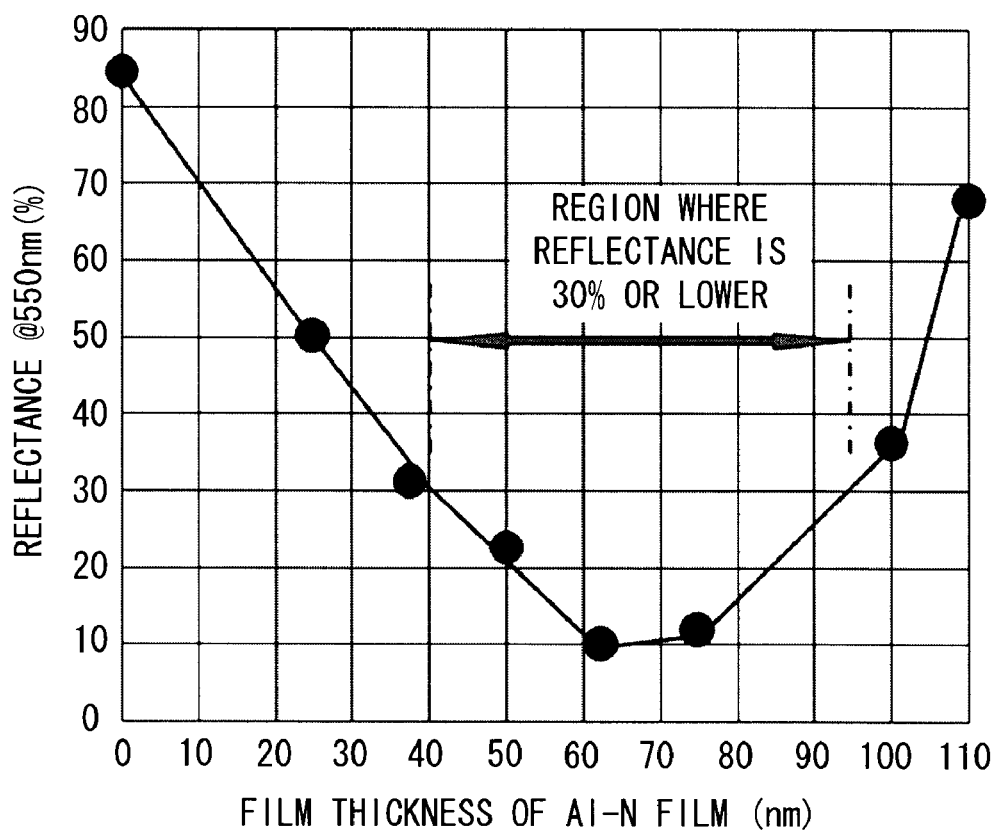
FIG. 13 is a view plotting a reflectance of an antireflection coating with respect to a film thickness of an Al—N film according to an example 2-3.

Next, a result of studying an optimum film thickness of the Al—N film 2a that serves as the first thin film of the antireflection coating 2 according to the second embodiment in the case where a material of the Al film 2b that serves as the second thin film of the antireflection coating 2 is changed to pure Al is described hereinafter. FIG. 13 is a view plotting a reflectance of a laminated film of an Al—N film serving as the first thin film and an Al film serving as the second thin film, just like FIG. 12. A sample was obtained by depositing an $Al_{100-x}N_x$ film with a selected thickness on the transparent insulating glass substrate 15 (n=1.5) with a thickness of 0.6 mm and further depositing a pure Al film with a fixed thickness of 200 nm as an Al film thereon.

In the sample of FIG. 13, an Al-48 at % N film with an N composition ratio of 48 at %, which is the same material as in the case of FIG. 12, was used as the first thin film. As the second thin film, a pure Al film was used as described above. Property values of the pure Al film were a reflectance of 85%, n (refractive index) of 1.10 and k (extinction coefficient) of 5.09. The laminated films ware etched all together at a time with use of a known drug solution of phosphoric acid+nitric acid+acetic acid.

FIG. 13 shows that a reflectance varies depending on the thickness of the first thin film. It is also shown that, in order to obtain the antireflection coating 2 with a reflectance of 50% or lower in the sample of FIG. 13, the thickness of the Al—N film 2a serving as the first thin film is in the range of approximately 25 nm to 105 nm. Further, in order to obtain the antireflection coating 2 with a reflectance of 30% or lower, the thickness of the first thin film is limited to the range of 40 nm to 95 nm, and in order to obtain the antireflection coating 2 with a reflectance of 10% or lower, the thickness of the first thin film is limited to the range of 60 nm to 80 nm. The Al—N film 2a where a reflectance is 10% or lower (with a thickness of 60 nm to 80 nm) was a so-called black film.

In the sample of FIG. 13, by limiting the thickness of the Al—N film 2a, which is the first thin film of the antireflection coating 2, to the range of 40 nm to 95 nm, it is possible to provide the antireflection coating 2 having lower reflectance characteristics than the antireflection coating 1 according to the first embodiment. In the sample of FIG. 13, the specific resistance of the antireflection coating 2 was $3.3 \times 10^{-6}$ O·cm. This is because of use of a pure Al film as the Al film 2b, which offers suitable conductive property.

Although the case where the Al-48 at % N film having light transmitting property is used as the first thin film is described in FIGS. 12 and 13, the present invention is not limited thereto, and the same advantage can be obtained also when an $Al_{100-x}N_x$ film with an N composition ratio of 40 at % or higher having light transmitting property with a transmittance of 10% or higher in FIG. 7 is used as the first thin film.

For example, in the sample structure shown in FIG. 12, if an Al-40 at % N film with a thickness of 50 nm (with a specific resistance of $2.5 \times 10^{-4}$ O·cm, n (refractive index) of 1.90 and k (extinction coefficient) of 2.80) was used as the first thin film instead of the Al-48 at % N film, a reflectance was 29%. Further, in the sample structure shown in FIG. 12, if an Al-45 at % N film with a thickness of 50 nm (with a specific resistance of 0.003 O·cm, n (refractive index) of 2.18 and k (extinction coefficient) of 1.08) was used as the first thin film instead of the Al-48 at % N film, a reflectance was 18%. In both cases, sufficiently low reflectance characteristics of 30% or lower were obtained. If an N composition ratio is 50 at %, wet etching using a known drug solution of phosphoric acid+ nitric acid+acetic acid becomes difficult, and therefore the upper limit of the N composition ratio is preferably less than 50 at %. Further, another element may be further added in addition to the N-element in consideration of improving heat resistance, corrosion resistance or the like.

Further, although the case of using the Al-39 at % N film as an example of the Al film 2b is described in the sample of FIG. 12, and the case of using the pure Al film as an example of the Al film 2b is described in the sample of FIG. 13, the film is not limited thereto as long as it is predominantly composed of Al and has light blocking property. For example, an element M different from N may be further added to Al in consideration of heat resistance, corrosion resistance or the like. If an element selected from a group 8 transition metal element is added as the element M, it is possible to realize suitable contact characteristics with a transparent conductive oxide film such as ITO, which has been difficult. Particularly, if at least one kind of element selected from Fe, Ni and Co is added, it is possible to realize more suitable contact characteristics. This enables suitable use as a black matrix for a color filter substrate which is electrically connected to an electrode such as ITO. Further, if a film having a specific resistance of lower than $2.5 \times 10^{-5}$ O·cm is used, it is possible to realize an antireflection coating having a lower specific resistance than that of an Mo or Cr film (with a specific resistance of $2.5 \times 10^{-5}$ O·cm), which is a known antireflection coating, thus being preferable. The total amount of an element, different from an N-element, to be added to Al preferably does not exceed 15 at % so as to obtain a film having a lower specific resistance than that of Cr or Mo hitherto used. Further, the thickness of the Al—N film is preferably set to the range of 40 nm to 95 nm with the object of easily designing a reflectance of 30 at % or lower, although it is not particularly limited within the scope of the present invention.

Because the antireflection coating 2 according to the second embodiment contains Al metal as a base, patterning is easy and a highly accurate pattern can be obtained. Further, as a result of intensive study, the inventors of the present invention have found that the Al—N film 2a serving as the first thin film of the antireflection coating 2 can have low reflection characteristics if an appropriate film thickness is set thereto.

Because the antireflection coating 2 has a specific resistance of $1 \times 10^{-2}$ O·cm or lower which is in the practical conductive region, it has conductive characteristics. Further, if a film having light blocking property and lower conductive property than the Al—N film 2a is used as the Al film 2b that serves as the second thin film of the antireflection coating 2, a film having low electric resistance characteristics can be provided. In the antireflection coating 2 that contains Cr, Fe, Ni, W, Zr, Ti or Mo as a base, a specific resistance exceeds $2.5 \times 10^{-5}$ (generally, a specific resistance of a thin film is higher than a value in bulk state). On the other hand, in the antireflection coating 2 according to the second embodiment, low electric resistance characteristics can be easily given by adjusting the Al film 2b that serves as the second thin film. As a result, it is possible to provide a material to be used both for a light blocking film and wiring. This enables suitable use as a wiring material of a large-size display panel with 15 inches in diagonal, for example, for which low electric resistance is required, particularly.

Further, the manufacturing method of the antireflection coating 2 according to the second embodiment can employ a known technique such as sputtering, and it is thus possible to use an existing facility without need of a special manufacturing device. For example, in the case of depositing an $Al_{100-x}N_x$ film as the first thin film and a pure Al film as the second thin film, control can be made by whether or not to use $N_2$ gas as sputtering gas. It is thereby possible to achieve cost reduction. In the case of adding the element M as well, the antireflection coating 2 can be manufactured in the same manner.

Although the case where the antireflection coating has a two-layer structure of the Al—N film 2a and the Al film 2b is described in the second embodiment, the same advantage as in the second embodiment can be obtained by a film in which a content of N decreases with a distance from the glass substrate 15. If the antireflection coating according to the first embodiment is formed as an $Al_{100-x}N_x$ film, it is possible to reduce a specific resistance while maintaining a reflectance of 30% to 50%.

Third Embodiment

The basic structure and the manufacturing method of an antireflection coating according to a third embodiment of the present invention are the same as those according to the above-described second embodiment except for the following point. Specifically, while the antireflection coating 2 according to the second embodiment has a two-layer structure of the Al—N film 2a and the Al film 2b, an antireflection coating 3 according to the third embodiment has a three-layer structure.

Figure 14:
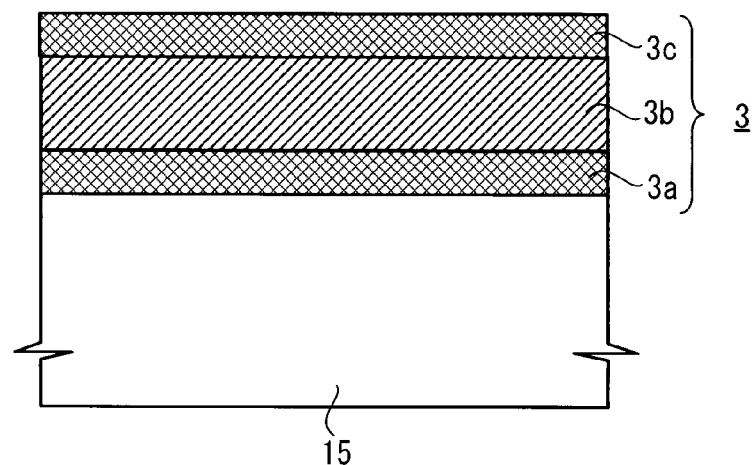
FIG. 14 is a schematic cross-sectional view of an antireflection coating according to a third embodiment of the present invention.

FIG. 14 is a schematic cross-sectional view of the antireflection coating 3 according to the third embodiment. As shown in FIG. 14, the antireflection coating 3 is formed on the glass substrate 15. Specifically, the antireflection coating 3 is made up of a first Al—N film 3a serving as a first thin film, an Al film 3b serving as a second thin film and a second Al—N film 3c serving as a third thin film which are laminated in this order on top of the glass substrate 15.

The first Al—N film 3a is predominantly composed of Al and at least contains N-element as an additive and further has both conductive property and light transmitting property. The Al film 3b is predominantly composed of Al and has both light blocking property and conductive property. The second Al—N film 3c is predominantly composed of Al and at least contains N-element as an additive and further has both conductive property and light transmitting property, just like the first Al—N film 3a. Further, metal other than Al may be added to each of those films independently of one another, so that they are an intermetallic compound, an alloy or the like composed of two or more kinds of metal. Although it is necessary for the first Al—N film 3a and the second Al—N film 3c to contain an N-element, it is not required for the Al film 3b serving as the second thin film to contain an N-element. In other words, the Al film 3b may contain an N-element as long as it maintains light blocking property and conductive property.

A preferred example of the antireflection coating 3 according to the third embodiment is described hereinafter (example 3-1). On the transparent insulating glass substrate 15 (n=1.5) with a thickness of 0.6 mm, an Al-48 at % N film with an N composition ratio of 48 at % was deposited with a thickness of 50 nm as the first Al—N film 3a. Then, an Al-39 at % N film with an N composition ratio of 39 at % was deposited with a thickness of 200 nm as the Al film 3b. Further, an Al-48 at % N film with an N composition ratio of 48 at % was deposited with a thickness of 50 nm as the second Al—N film 3c.

The characteristics of the Al-48 at % N film, used as the first Al—N film 3a and the second Al—N film 3c, were a light transmittance of 80%, a specific resistance of 0.05 O·cm, n (refractive index) of 2.31 and k (extinction coefficient) of 0.083. The characteristics of the Al-39 at % N film, used as the Al film 3b, were a reflectance of 41%, n (refractive index) of 1.84 and k (extinction coefficient) of 2.97.

The first Al—N film 3a, the Al film 3b and the second Al—N film 3c according to the example 3-1 were etched all together at a time with use of a known drug solution of phosphoric acid+nitric acid+acetic acid, as in the first embodiment.

Figure 15:
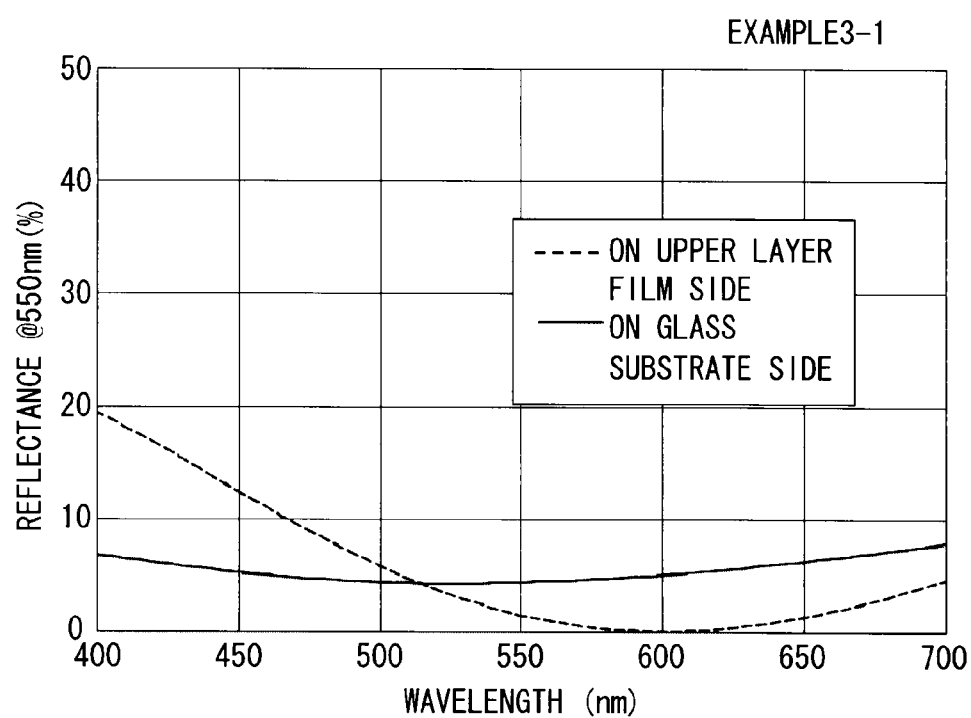
FIG. 15 is a view showing a wavelength dependence of a reflectance of an antireflection coating according to an example 3-1.

FIG. 15 is a graph showing a wavelength dependence of a reflectance of the antireflection coating 3 according to the example 3-1. In the graph, the full line indicates a reflectance of the antireflection coating 3 measured from the side of the glass substrate surface, and the broken line indicates a reflectance of the antireflection coating 3 measured from the side of the upper layer film, which is an interface with air.

As shown in FIG. 15, a reflectance at a wavelength of 550 nm was 1.6% on the upper layer film side and 4.5% on the glass substrate side, thus having a very low reflectance. The second Al—N film 3c, which is the surface layer on the upper layer film side, and the first Al—N film 3a, which is the surface layer on the glass substrate side, were so-called black films. Further, the specific resistance of the antireflection coating 3 according to the example 3-1 was $2.7 \times 10^{-4}$ O·cm.

Reflectance characteristics are generally different between the upper layer film side and the glass substrate side because of a difference in the effect of the optical property of the glass substrate or the like. Basically, however, the antireflection effect is equally obtained on the upper layer film side also. Thus, if the antireflection function is necessary only on the upper layer film side, for example, a two-layer structure that excludes the first Al—N film 3a in the lowermost layer in FIG. 14 may be used. Further, the first Al—N film 3a and the second Al—N film 3c are not limited to the Al-48 at % N film, and the advantage of the present invention can be obtained with use of any Al—N film having light transmitting property and in the region having conductive property. In the case of using an $Al_{100-x}N_x$ film, an $Al_{100-x}N_x$ film with an N composition ratio of equal to or hither than 40 at % and lower than 50 at % may be applied.

The antireflection coating 3 according to the third embodiment has the same advantage as the antireflection coating 2 according to the second embodiment. Although the case where the antireflection coating 3 has a three-layer structure is described in the third embodiment, the boundary between layers is not necessarily clear, and a film having substantially the above-described structure may be deposited by gradually changing an N composition ratio in the thickness direction.

Fourth Embodiment

The case of applying an antireflection coating according to an embodiment of the present invention to a liquid crystal display device is described hereinafter. In a fourth embodiment of the present invention, an antireflection coating according to an embodiment of the present invention is applied to a color filter substrate of a twisted nematic (TN) mode liquid crystal display device by way of illustration.

In the liquid crystal display device according to the fourth embodiment, a color filter substrate and an active matrix substrate are placed opposite to each other with a certain gap therebetween, and a liquid crystal layer is placed in the gap. On the active matrix substrate (not shown), a pixel electrode for driving liquid crystals, a gate line (scanning signal line), a source line (image signal line), a thin film transistor (TFT) and so on are formed. A plurality of gate lines and a plurality of source lines are respectively formed in the same direction, and the gate lines and the source lines are substantially orthogonal to each other with an insulating film therebetween. A region surrounded by the adjacent gate lines and the adjacent source lines serves as a pixel. Further, a TFT device for driving each pixel is formed in a matrix in a region where the gate line and the source line intersect with each other.

Figure 16A:
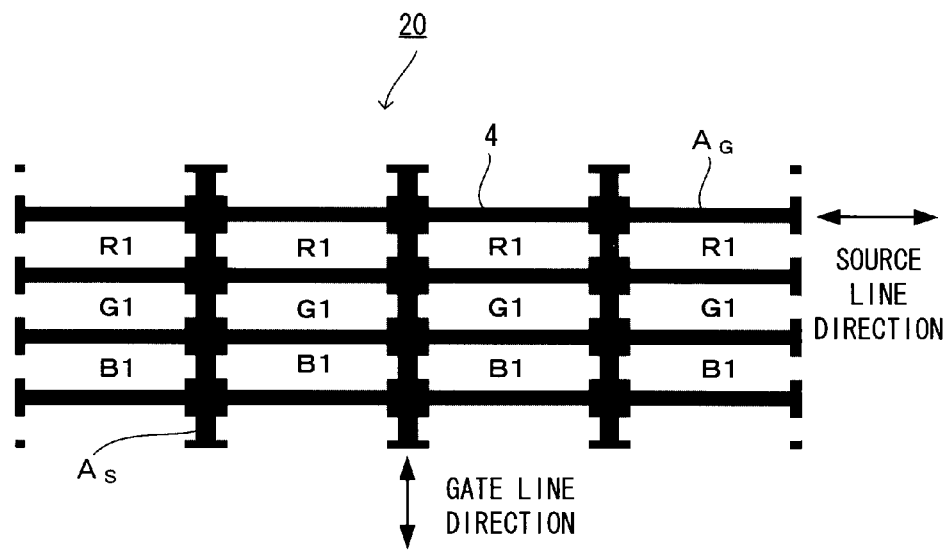
FIG. 16A is a schematic plan view of a black matrix according to a fourth embodiment of the present invention.
Figure 16B:
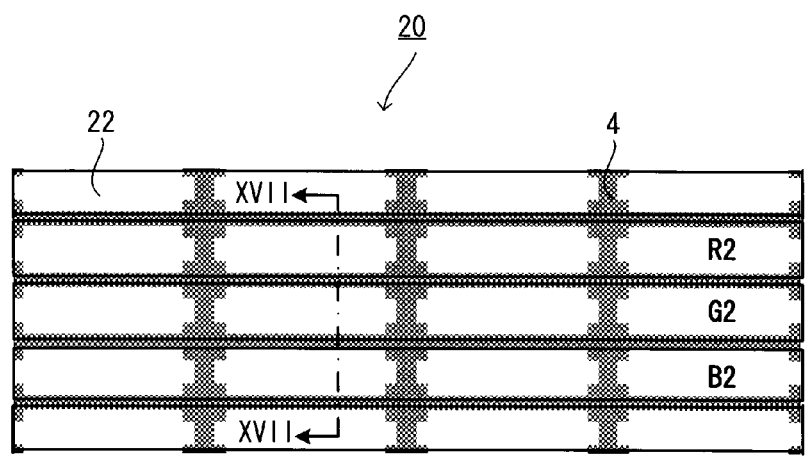
FIG. 16B is a schematic plan view of a color filter layer according to a fourth embodiment of the present invention.
Figure 17:
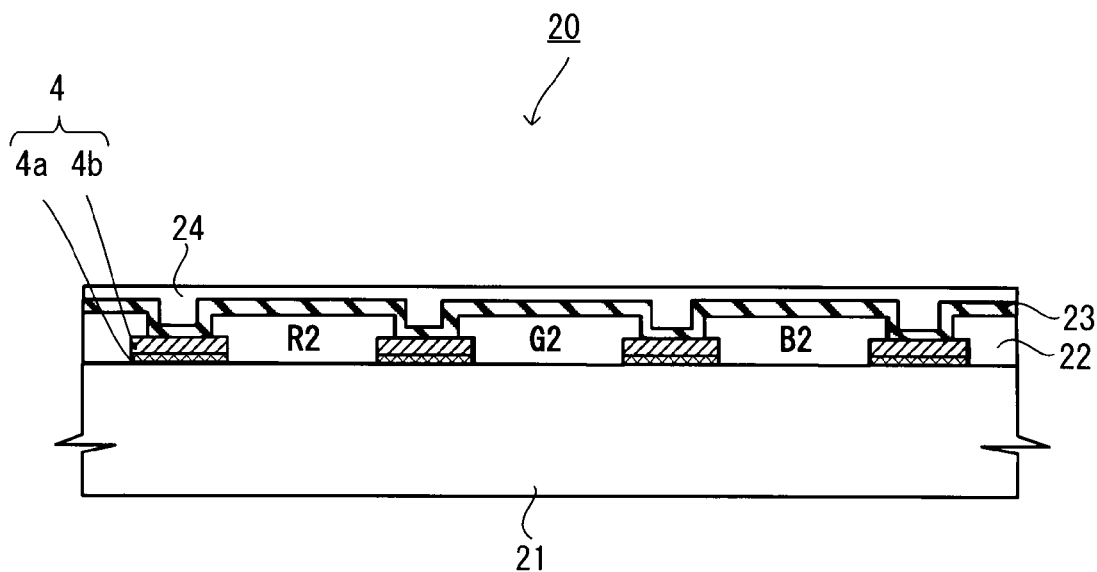
FIG. 17 is a cross-sectional view along line XVII-XVII in FIG. 16B.

FIG. 16A is a schematic plan view of a black matrix of a color filter substrate 20 according to the fourth embodiment, and FIG. 16B is a schematic plan view of a color filter layer. FIG. 16B also shows a black matrix in order to illustrate the positional relationship of the black matrix and the color filter layer. FIG. 17 is a cross-sectional view along line XVII-XVII in FIG. 16B.

The color filter substrate 20 according to the fourth embodiment includes a transparent insulating substrate 21, an antireflection coating 4 to serve as a black matrix layer, a color filter layer 22, a counter electrode 23, an alignment film 24 and so on.

The antireflection coating 4 is formed on the transparent insulating substrate 21 so as to correspond to the matrix of pixels so as to function as a black matrix (cf. FIG. 16A). As shown in FIG. 16A, in pixel regions, three primary color display pixel regions, i.e., red display pixel regions R1, green display pixel regions G1 and blue display pixel regions B1, are respectively placed along the source line direction in an alternate manner so as to make color display. As the antireflection coating 4, the antireflection coating according to the above-described first to third embodiment may be applied appropriately. In this example, the film having a two-layer structure as in the second embodiment is described. The antireflection coating 4 has a two-layer structure of the Al—N film 4a and the Al film 4b as shown in FIG. 17.

The color filter layer 22 is formed on the transparent insulating substrate 21 where the antireflection coating 4 is formed. Specifically, a red color filter layer R2, a green color filter layer G2 and a blue color filter layer B2 are placed corresponding to the respective pixel regions described above (cf. FIG. 17).

The counter electrode 23 is formed on top of the color filter layer 22 so as to generate an electric field for driving the liquid crystal layer (not shown) between a pixel electrode of the active matrix substrate (not shown) and the counter electrode 23. As the counter electrode 23, an ITO film is used in the fourth embodiment. The alignment film 24 is formed on top of the counter electrode 23 so as to align liquid crystal molecules in a given direction. As the alignment film 24, a polyimide film or the like may be suitably used.

The antireflection coating 4 prevents mixture of colors or interference of the three primary color filter in the adjacent pixels and blocks light in a display light degradation area at the end of the pixel region, thereby increasing the contrast of a display image. Therefore, the antireflection coating 4 is formed in a matrix manner in a region $A_G$ for blocking light to the gate line and a region $A_S$ for blocking light to the source line as shown in FIG. 16A.

A method of manufacturing the color filter substrate 20 is described hereinafter. First, the antireflection coating 4 to function as a black matrix is formed on the transparent insulating substrate 21. As the Al—N film 4a, an Al-3 at % Ni alloy target in which Ni with a composition ratio of 3 at % was added to Al was used, and an Al-3 at % Ni-45 at % N film with a thickness of 50 nm was deposited by reactive sputtering with use of Ar+$N_2$ mixed gas. Then, as the Al film 4b, an Al-3 at % Ni film with a thickness of 200 nm was deposited by sputtering with use of pure Ar gas.

Next, a photoresist pattern was formed by photolithography and wet etching was performed by using the obtained pattern as a mask. As a drug solution, a drug solution of phosphoric acid+nitric acid+acetic acid, which is a known Al metal etchant, was used. After that, the photoresist pattern was removed, thereby obtaining the pattern of the antireflection coating 4.

Figure 18:
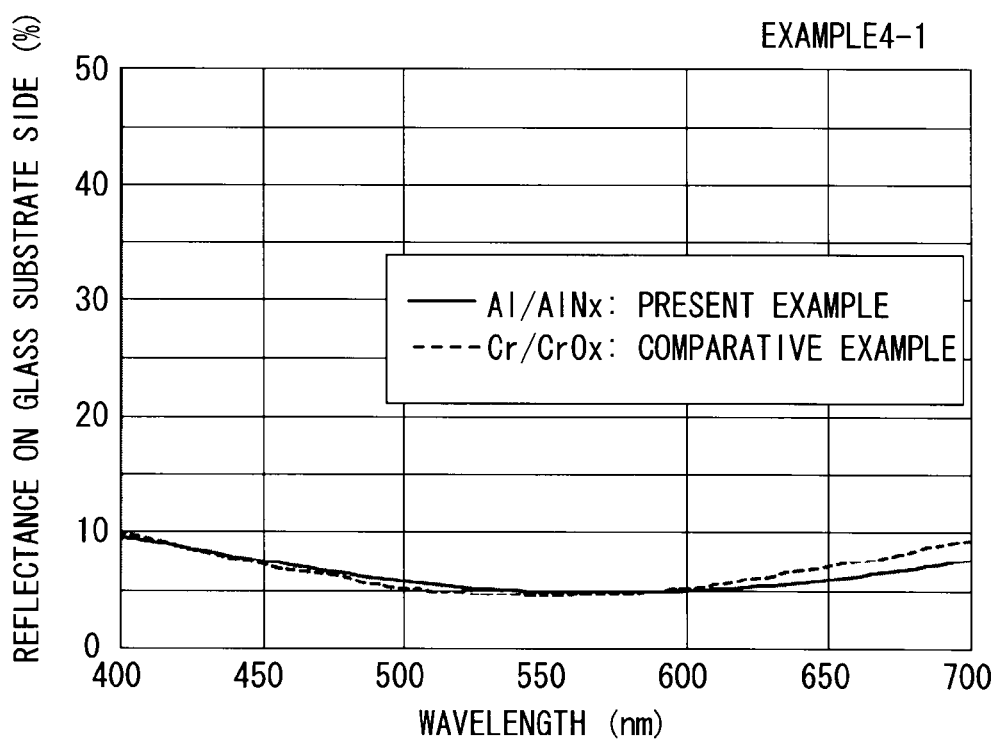
FIG. 18 is a view showing a wavelength dependence of a reflectance of an antireflection coating according to an example 4-1.

A reflectance L2 of the obtained antireflection coating 4 for incident light L1 from the glass substrate side was 4.9%, and thus a black film having very low reflection characteristics was obtained. FIG. 18 shows a result of a wavelength dependence of a reflectance of the antireflection coating 4 according to the fourth embodiment. FIG. 18 also shows a result of an antireflection coating having a known Cr/$CrO_y$ laminated structure. FIG. 18 indicates that the antireflection coating 4 according to the fourth embodiment has low reflection characteristics that are equal to the antireflection coating having the known Cr/$CrO_y$ laminated structure.

The specific resistance of the antireflection coating 4 was $5.0 \times 10^{-6}$ O·cm. On the other hand, the specific resistance of the known Cr/$CrO_y$ film was $25 \times 10^{-6}$ O·cm. Thus, the antireflection coating 4 according to the fourth embodiment has a specific resistance of about ⅕ of that of the antireflection coating hitherto used (Cr/$CrO_y$ laminated film).

After forming the antireflection coating 4, a read color resist in which a red coloring matter is mixed with photosensitive resin was created, and a red color filter layer R2 was formed by photolithography. In the same manner, a green color filter layer G2 and a blue color filter layer B2 were sequentially formed.

Then, the counter electrode 23 for applying an electric signal (electric field) for driving liquid crystals is formed. As a preferred example, a transparent conductive oxide film ITO in which indium oxide ($In_2O_3$) and tin oxide ($SnO_2$) were mixed with a weight ratio of 9:1 was deposited with a thickness of 100 nm. The specific resistance of the ITO film was $250 \times 10^{-6}$ O·cm.

The ITO film that forms the counter electrode 23 was in direct contact with the surface of the Al film 4b, which is the upper-layer film of the antireflection coating 4, in the region between the respective color filters. If the Al film and the ITO are in direct contact, the Al and the O-element from the ITO react with each other at the interface to form an insulating $Al_{100-x}O_x$ (aluminum oxide), thus being an insulating state.

On the other hand, because Ni is added to Al in the antireflection coating 4 according to the fourth embodiment, reaction of the $Al_{100-x}O_x$ film can be suppressed, contact resistance is reduced, and suitable conductive state can be thereby achieved.

According to the fourth embodiment, the ITO film of the counter electrode 23 and the low-reflection antireflection coating 4 formed in matrix are electrically connected. The antireflection coating 4 according to the fourth embodiment has a specific resistance of about ⅟₅₀ of that of the ITO film. Therefore, by electrically connecting the counter electrode 23 to the antireflection coating 4 in a suitable state, it is possible to reduce the resistance of the counter electrode all over the substrate. It is thereby possible to uniformly reduce the resistance of the counter electrode all over a screen when it is applied to a large-size liquid crystal display panel such as TV, for example. Consequently, it is possible to prevent a defect of an applied electric field, uneven distribution of an applied electric field strength or the like to liquid crystals, thus enabling prevention of a decrease in quality such as display unevenness.

After forming the counter electrode 23, the alignment film 24 is formed. In this example, a transparent resin film made of polyimide was formed with a thickness of 100 nm. By the above process, the color filter substrate for the liquid crystal display panel according to the embodiment is manufactured. Then, a process of attaching the color filter substrate to an active matrix substrate with a certain gap therebetween, filling the gap with liquid crystals or the like is performed, thereby manufacturing a color liquid crystal display panel.

Although an Al-3 at % Ni alloy target is used in the above example, the present invention is not limited thereto. The effect of adding Ni is to reduce electrical contact resistance at the interface with the conductive oxide film such as ITO and obtain a suitable conductive state. In order to obtain the sufficient effect, a composition ratio of the added Ni is preferably 0.5 at % or higher. On the other hand, the specific resistance of the Al—N film becomes higher by the addition of Ni. In order to bring an advantage as a low electric resistance film by reducing the resistance to be lower than the specific resistance $2.5 \times 10^{-5}$ O·cm of an Mo or Cr film, which is a known low reflection film, for example, the added amount of Ni is preferably 15 at % or lower. Further, the equal effect can be obtained when Fe or Co, which is a group 8 transition metal element just like Ni, is added as an element to be added to Al. In this case also, the added amount of an element different from Al is preferably 15 at % or lower in terms of maintaining a suitable specific resistance.

Further, although the case where the antireflection coating having a black matrix function is used for the color filter substrate is described in the fourth embodiment, it may be applied to any antireflection coating for which a black matrix function is required. For example, it may be used for a field sequential (FS) counter substrate.

Fifth Embodiment

The case of applying an antireflection coating according to an embodiment of the present invention to an active matrix substrate of a liquid crystal display device is described hereinafter. A liquid crystal display device according to a fifth embodiment of the present invention is TN mode, which is the same as in the fourth embodiment.

Figure 19:
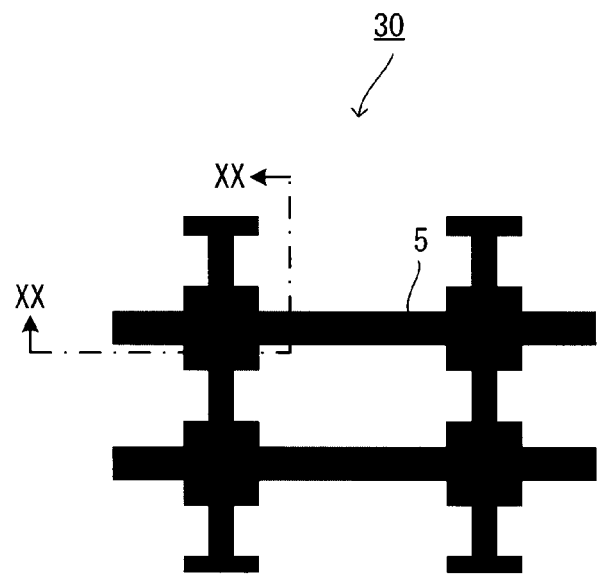
FIG. 19 is a plan view showing a part of an antireflection coating on an active matrix substrate according to a fifth embodiment of the present invention.
Figure 20:
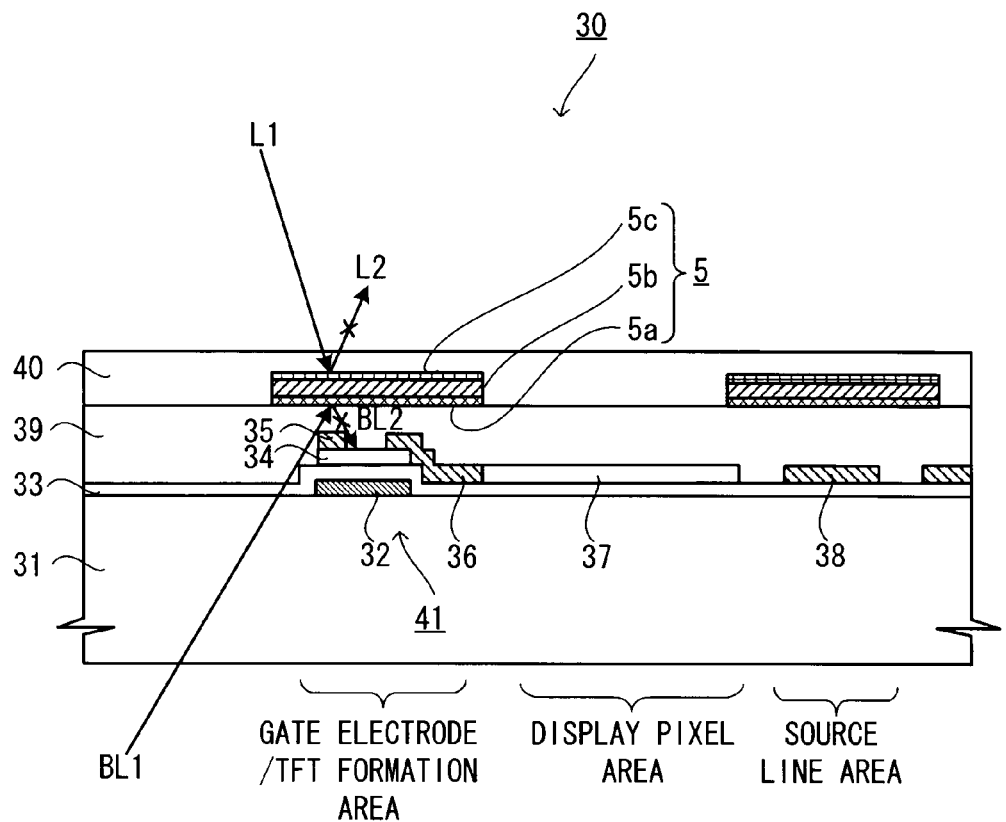
FIG. 20 is a cross-sectional view along line XX-XX in FIG. 19.

FIG. 19 is a schematic plan view showing a part of an antireflection coating 5 in an active matrix substrate according to the fifth embodiment, and FIG. 20 is a cross-sectional view of the active matrix substrate along the alternate long and short dash line XX-XX in FIG. 19. An antireflection coating 5 is formed in a substantially matrix fashion on an active matrix substrate 30 that includes an electrode for driving liquid crystals, a wiring pattern, TFT and so on.

As shown in FIG. 20, the active matrix substrate 30 includes a transparent insulating substrate 31, a gate electrode 32 made of a conductive film or the like, a gate insulating film 33 made of a $SiN_y$ film or the like, a semiconductor active film 34 composed of Si or the like that functions as a semiconductor layer of TFT, a source electrode 35 and a drain electrode 36 made of a conductive film, a pixel electrode 37, a source line 38, an interlayer insulating film 39, an alignment film 40 and so on.

The gate electrode 32 is formed on the transparent insulating substrate 31 in the same layer as a gate line (not shown) as shown in FIG. 20.

In the active matrix substrate 30, each gate line (not shown) extends in the lengthwise direction, and a plurality of gate lines are arranged in the crosswise direction. The gate line in a TFT formation area functions as a gate electrode 32. Each source line 38 extends in the crosswise direction so as to intersect with the gate line, and a plurality of source lines 38 are arranged in the lengthwise direction. The plurality of gate lines and the plurality of source lines are substantially orthogonal to each other to form a matrix pattern, and a region surrounded by the adjacent gate lines and the adjacent source lines serves as a pixel. Thus, pixels are arranged in matrix. A region where a plurality of pixels are formed is a display region.

Near the point of intersection between the gate line and the source line in each pixel, at least one TFT 41 for signal transmission is formed. The gate electrode 32 of the TFT 41 formed in a pixel is connected to the gate line, and the source electrode 35 of the TFT 41 is connected to the source line 38. If a voltage is applied to the gate electrode 32, a current flows through the source line 38. A display voltage is thereby applied from the source line 38 to the pixel electrode 37 connected to the drain electrode 36 of the TFT 41.

The gate electrode 32 is formed on the transparent insulating substrate 31 such as glass, and it is formed by the same conductive film as the gate line, an auxiliary capacitor line, a gate terminal or the like.

The gate insulating film 33 is formed so as to cover the gate electrode 32. The semiconductor active film 34 and an ohmic low electric resistance film (not shown) are formed on the gate insulating film 33 and placed opposite to at least a part of the gate electrode 32 with the gate insulating film 33 interposed therebetween. The semiconductor active film 34 is made of a silicon (Si) film which does not contain an impurity, and the ohmic low electric resistance film is made of an ohmic low electric resistance Si film to which an impurity is added, for example.

The source electrode 35 and the drain electrode 36 are placed opposite to at least a part of the gate electrode 32 with the gate insulating film 33, the semiconductor active film 34 and the ohmic low electric resistance film interposed therebetween. Specifically, a thin film transistor region exists above the gate electrode 32 for operation as the TFT 41, so that it is likely to be affected by an electric field when a voltage is applied to the gate electrode 32. The drain electrode 36 is formed by the same layer as the source line 38, the source electrode 35, a source terminal or the like.

The interlayer insulating film 39 is formed to as to cover the gate insulating film 33, the semiconductor active film 34, the source electrode 35, the drain electrode 36 and the pixel electrode 37 (c.f. FIG. 20).

The antireflection coating 5 is formed on the interlayer insulating film 39 so as to overlap with the gate line, the source line 38 and the TFT 41. As the antireflection coating 5, the structure of the above-described first to third embodiment can be applied suitably. In the fifth embodiment, the antireflection coating 5 has a three-layer structure as described in the third embodiment. Specifically, the antireflection coating 5 is a laminated film in which a first Al—N film 5a serving as a first thin film, an Al film 5b having light blocking property serving as a second thin film and a second Al—N film 5c serving as a third thin film are laminated in this order from below.

The alignment film 40 is formed on the surface of the active matrix substrate 30 so as to align liquid crystals in a given direction.

The active matrix substrate 30 having the above structure is then attached to a color filter substrate with a certain gap (cell gap) therebetween, liquid crystals are filled in the gap, and then the substrates are sealed. Further, a polarizing plate, a retardation plate and so on are placed on the outer sides of the active matrix substrate 30 and the color filter substrate. Furthermore, a backlight unit or the like is placed on the non-viewing side of the liquid crystal display panel. The liquid crystal display device according to the fifth embodiment has the above-described structure.

In the case of using an antireflection coating having the three-layer structure described in the third embodiment as the antireflection coating 5, a wavelength dependence of a reflectance on the glass substrate side and a wavelength dependence of a reflectance on the uppermost layer film side are the same as the results shown in FIG. 15. Specifically, a reflectance at a wavelength of 550 nm was 1.6% on the film side and the 4.5% on the glass substrate side, which is very low, and so-called black film characteristics were obtained on both sides.

Because the antireflection coating 5 according to the fifth embodiment has the three-layer structure, it is possible to prevent incident light BL1 from the backlight for pixel display from illuminating the Si semiconductor active film 34 of the TFT as reflected light BL2. It is thereby possible to prevent an increase in off-current of the TFT due to photoexcitation (degradation of TFT characteristics due to light). This has a large effect on preventing the degradation of display characteristics when the intensity of backlight is high as a high-luminance display panel, for example.

Further, because reflected light L2 of background light L1 that is incident from the display image viewing side is also reduced, it is possible to prevent the background from being reflected on the display panel. This enables high-quality display with high visibility. The effect of preventing the degradation of TFT characteristics due to reflection of the backlight is also obtained in the fourth embodiment. Thus, it is possible to suitably apply the antireflection coating having the three-layer structure also in the fourth embodiment just like the fifth embodiment. Further, by applying the antireflection coating 5 according to the fifth embodiment also to the black matrix of the color filter substrate according to the fourth embodiment, it is possible to share a material or a manufacturing device and thereby achieve cost reduction.

The antireflection coating 5 according to the fifth embodiment enables low reflection characteristics or black film characteristics to be achieved easily and at low cost by using Al metal that originally has high light reflectance but has low electric resistance as a base. Thus, by applying the antireflection coating 5 according to the fifth embodiment to a black matrix of a counter electrode substrate such as a color filter substrate for driving liquid crystals, it is possible to reduce the resistance of the counter electrode. It is particularly effective in use for a large-size liquid crystal panel for which low electric resistance of a counter electrode is required.

Sixth Embodiment

Figure 21:
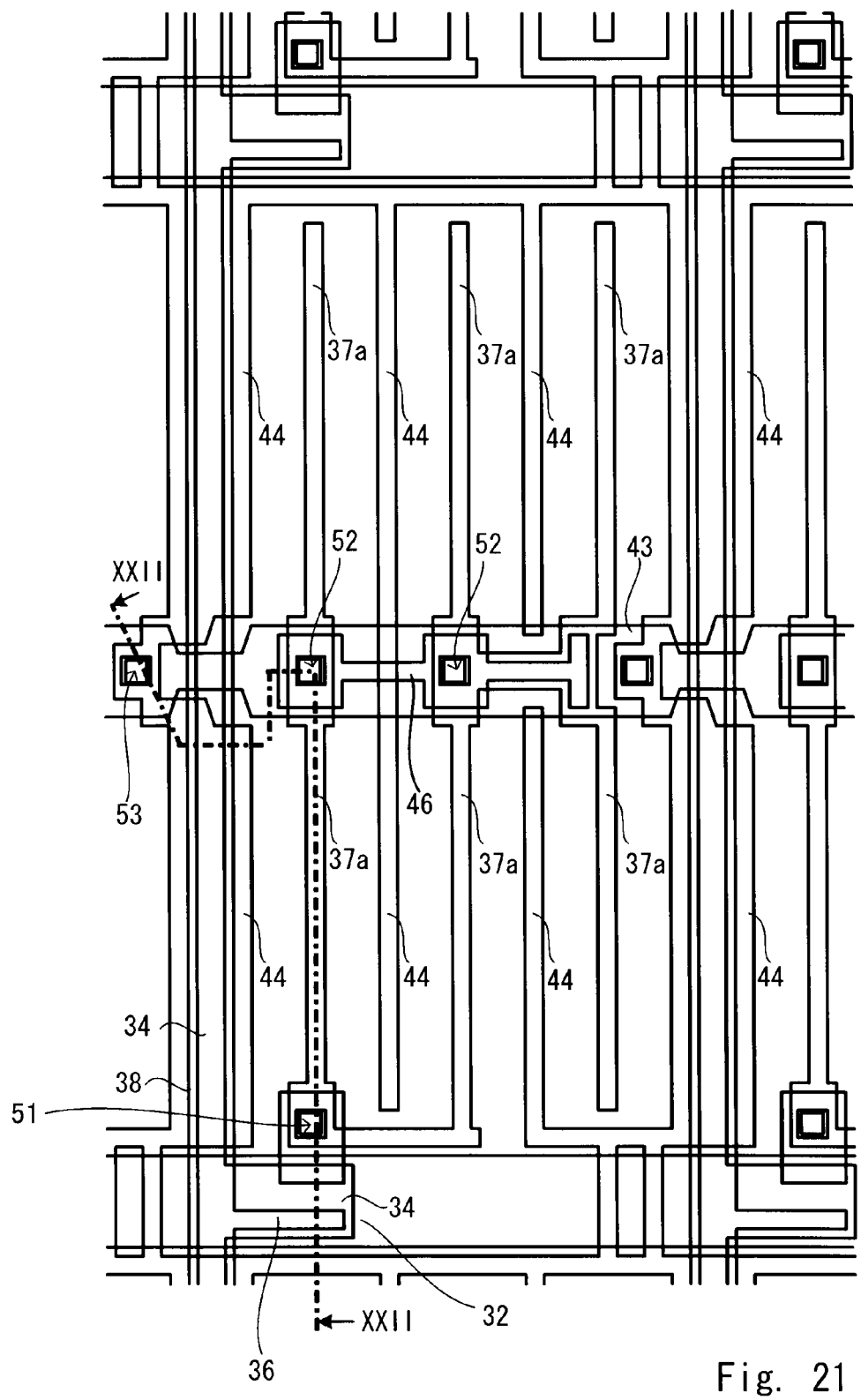
FIG. 21 is a schematic plan view showing a part an active matrix substrate according to a sixth embodiment of the present invention.
Figure 22:
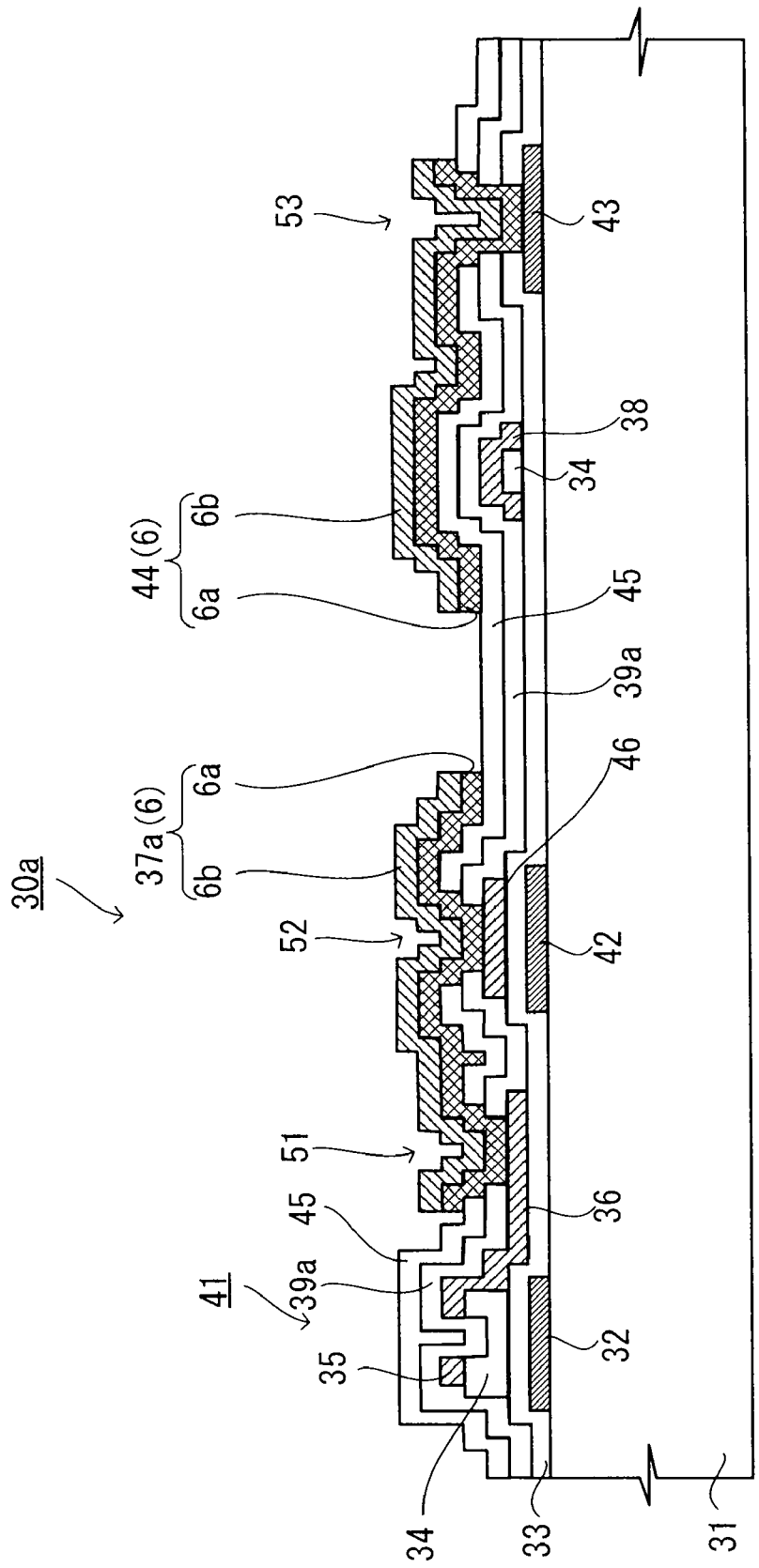
FIG. 22 is a cross-sectional view along line XXII-XXII in FIG. 21.

The case of applying the antireflection coating according to an embodiment of the present invention to an in-plane switching (IPS) mode liquid crystal display device where liquid crystals are aligned substantially in parallel with a panel surface is described hereinafter. FIG. 21 is a schematic plan view showing a part of an active matrix substrate 30a according to a sixth embodiment of the present invention, and FIG. 22 is a cross-sectional view along line XXII-XXII in FIG. 21. The same elements as in the fifth embodiment are denoted by the same reference symbols and the explanation thereof is omitted as appropriate.

The active matrix substrate 30a according to the sixth embodiment includes a transparent insulating substrate 31, a gate electrode 32, a gate insulating film 33, a semiconductor active film 34, a source electrode 35, a drain electrode 36, a pixel electrode 37a, an interlayer insulating film 39a, an auxiliary capacitor electrode 42, a common electrode 43, a counter electrode 44, a protection film 45 and so on. A TFT 41 is formed on the transparent insulating substrate 31 by the gate electrode 32, the source electrode 35, the drain electrode 36, the gate insulating film 33, the semiconductor active film 34 and so on.

The liquid crystal display device according to the sixth embodiment drives liquid crystals by applying an electric signal (electric field) in a pixel area in parallel with the display panel plane. Thus, the pixel electrode 37a and the counter electrode 44 in a comb tooth shape are formed opposite to each other in the same layer above the interlayer insulating film 39a.

The pixel electrode 37a is electrically connected to the drain electrode 36 of the TFT 41 in the lower layer through a contact hole 51 and supplies an image signal voltage thereto, and also connected to a lower metal pattern 46 through a contact hole 52, so that it is placed opposite to the auxiliary capacitor electrode 42 with the gate insulating film 33 interposed therebetween and forms a capacitor for holding an image signal for a given length of time. On the other hand, the counter electrode 44 is electrically connected to the common electrode 43 in the lower layer through a contact hole 53 and supplies a given common voltage thereto. By the pixel electrode 37a and the counter electrode 44 configured as above, an image signal is applied to the pixel in a substantially parallel manner to the substrate (liquid crystal panel).

As shown in FIG. 21, because the pixel electrode 37a and the counter electrode 44 are placed in the display pixel area in a substantially comb tooth shape, it is preferred to use a transparent conductive film such as ITO in order to enlarge a light transmitting region (opening). However, in the case of a large-size liquid crystal display panel for a TV or the like, a specific resistance is large in the ITO film, and thus the reflectance of the pixel electrode and the counter electrode all over the screen is large. This causes delay of an image signal or uneven distribution of potentials, which leads to display defects such as contrast decrease or display unevenness.

In light of the above, a technique of uniformly reducing the resistance of the electrodes with use of Al metal having a low specific resistance is considered. However, the use of Al metal raises a new issue such as a change of color or a decrease in contrast due to the effect of reflected light.

In the sixth embodiment, the pixel electrode 37a and the counter electrode 44 are formed by an antireflection coating 6 according to an embodiment of the present invention. The antireflection coating 6 according to the sixth embodiment has a two-layer structure in which an Al film 6a serving as a first thin film and an Al—N film 6b serving as a second thin film are laminated in this order. The Al film 6a of the antireflection coating 6 is predominantly composed of Al and has both light blocking property and conductive property. The Al—N film 6b of the antireflection coating 6 is predominantly composed of Al and at least contains nitrogen as an additive and further has both light transmitting property and conductive property. In other words, the pixel electrode 37a and the counter electrode 44 are formed by the antireflection coating 6 having the two-layer structure of the Al film 6a and the Al—N film 6b.

A preferred example is described hereinafter by way of illustration, although the present invention is not limited thereto. As the Al film 6a, a pure Al film with a specific resistance of $3.3 \times 10^{-6}$ O·cm (with n (refractive index) of 1.10 and k (extinction coefficient) of 5.09) was deposited with a thickness of 200 nm. As the Al—N film 6b having light transmitting property, an Al-48 at % N film with a transmittance of 80% (with n (refractive index) of 2.31 and k (extinction coefficient) of 0.083) was deposited with a thickness of 50 nm. The Al film 6a and the Al—N film 6b were deposited in succession by sputtering.

In this example, a reflectance measured from the upper layer film side was about 20%, and sufficiently low reflection characteristics were obtained. Next, known photolithography and wet etching with use of a drug solution of phosphoric acid+nitric acid+acetic acid were performed, thereby forming the pattern of the pixel electrode 37a and the pattern of the counter electrode 44 at the same time.

The IPS mode liquid crystal display panel manufactured in the above manner enables reduction of the resistance of the pixel electrode 37a and the counter electrode 44 uniformly all over the screen and suppression of the effect of a reflected component of light from those electrodes in the pixel display area. Consequently, it is possible to provide a liquid crystal display device having display characteristics with high color purity and contrast.

Seventh Embodiment

The basic structure and the manufacturing method of an antireflection coating according to a seventh embodiment of the present invention are the same as those according to the above-described second embodiment except for the following point. Specifically, while the Al—N film 2a that serves as the first thin film contains an N-element as an additive in the antireflection coating 2 according to the second embodiment, an Al—N film that serves as the first thin film further contains an O-element in addition to an N-element as an additive in an antireflection coating 7 according to the seventh embodiment. In the following description, an Al—N film in which an O-element is further added in addition to an N-element is also referred to as an "Al—N+O film" for simplification of description.

Figure 23:
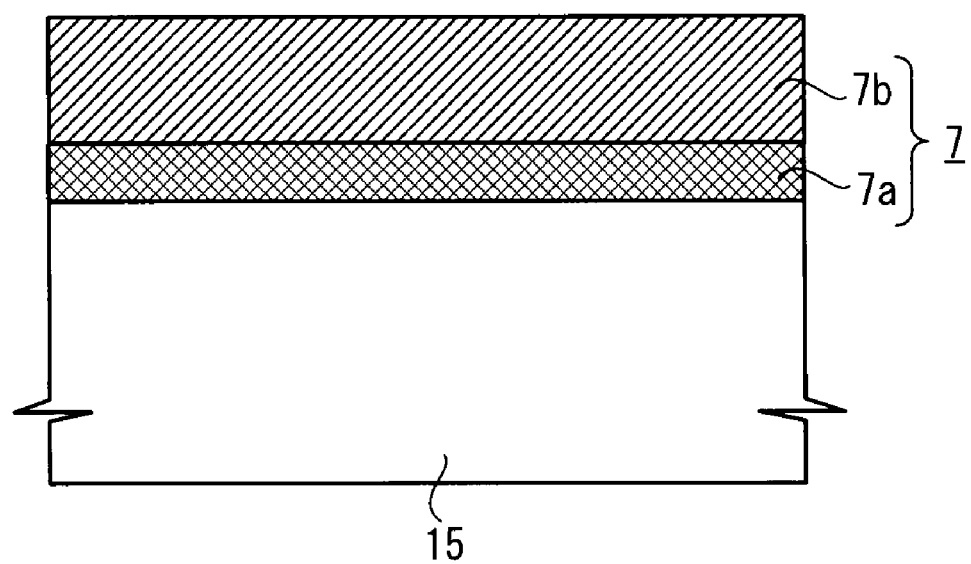
FIG. 23 is a schematic cross-sectional view of an antireflection coating according to a seventh embodiment of the present invention.

FIG. 23 is a schematic cross-sectional view of the antireflection coating 7 according to the seventh embodiment. As shown in FIG. 23, the antireflection coating 7 is formed on the glass substrate 15. Specifically, the antireflection coating 7 is made up of an Al—N+O film 7a that is an Al—N film serving as a first thin film and an Al film 7b serving as a second thin film, which are laminated in this order on top of the glass substrate 15.

The Al—N+O film 7a is predominantly composed of Al and at least contains an N-element and an O-element as an additive and further has both conductive property and light transmitting property. The Al film 7b is predominantly composed of Al and has both light blocking property and conductive property. Further, metal other than Al may be added to each of the Al—N+O film 7a and the Al film 7b independently of each other, so that they are an intermetallic compound, an alloy or the like composed of two or more kinds of metal. Although it is necessary for the Al—N+O film 7a to contain at least an N-element and an O-element, it is not required for the Al film 7b to contain an N-element and/or an O-element. In other words, the Al film 7b may contain an N-element and/or an O-element as long as it maintains light blocking property and conductive property.

As a result of further intensive study, the inventors of the present invention have found that, if an O-element is added to an Al—N film that serves as the first thin film, the film has good characteristics. They have also found that it is not preferred to add an O-element without adding an N-element to an Al film in terms of etching property and a specific resistance increase. The reason is described hereinbelow.

Figure 24:
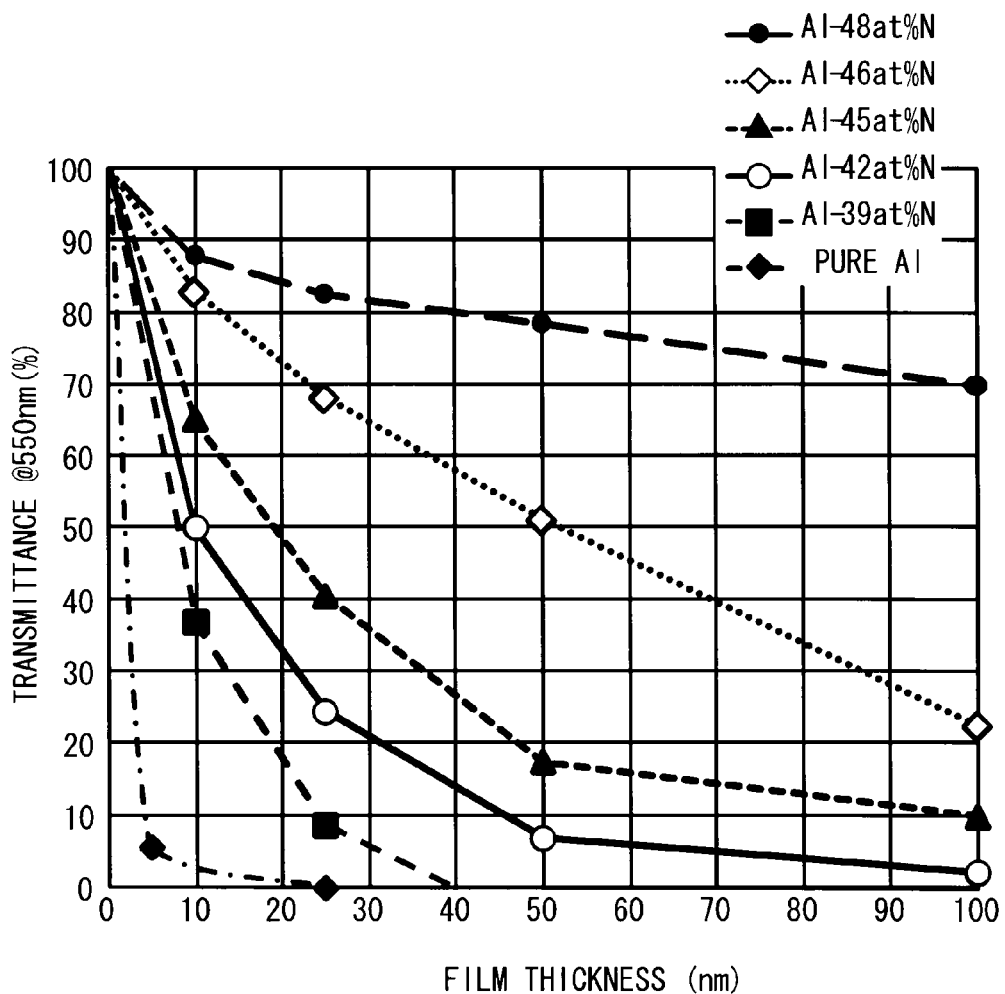
FIG. 24 is a view plotting a film thickness dependence of a transmittance with respect to an N composition ratio (at %) in an $Al_{100-x}N_x$ film.

FIG. 24 is a view plotting a wavelength dependence of a transmittance at a wavelength of 550 nm with respect to a film thickness of an $Al_{100-x}N_x$ film. As the $Al_{100-x}N_x$ film, the respective samples of a pure Al film, an Al-39 at % N film, an Al-42 at % N film, an Al-45 at % N film, an Al-46 at % N film and an Al-48 at % N film were studied. The $Al_{100-x}N_x$ film was formed by sputtering with use of a metal target of pure Al and use of mixed gas in which $N_2$ gas is added to pure Ar gas, as in the first embodiment. The various N composition ratios were made by changing the amount of $N_2$ gas added to pure Ar gas.

FIG. 24 shows that when a film thickness is 25 nm, a transmittance is slightly smaller than 10% at an N composition ratio of 39 at %. A transmittance value increases as an N composition ratio increases, it exceeds 80% at an N composition ratio of 48 at %. In other words, by setting an N composition ratio in an $Al_{100-x}N_x$ film to be at least 40 at %, it is possible to obtain the "film having light transmitting property (film having a transmittance of 10% or higher at a thickness of 25 nm)" as defined in this description. Of course, the light transmitting property varies according to addition of another additive or the like. Therefore, a film with an N composition ratio of less than 40 at % is not excluded based on this result. Further, as described above, the light transmitting property generally appears in a metal thin film that does not have light transmitting property if the film thickness is set to be very small.

Figure 25:
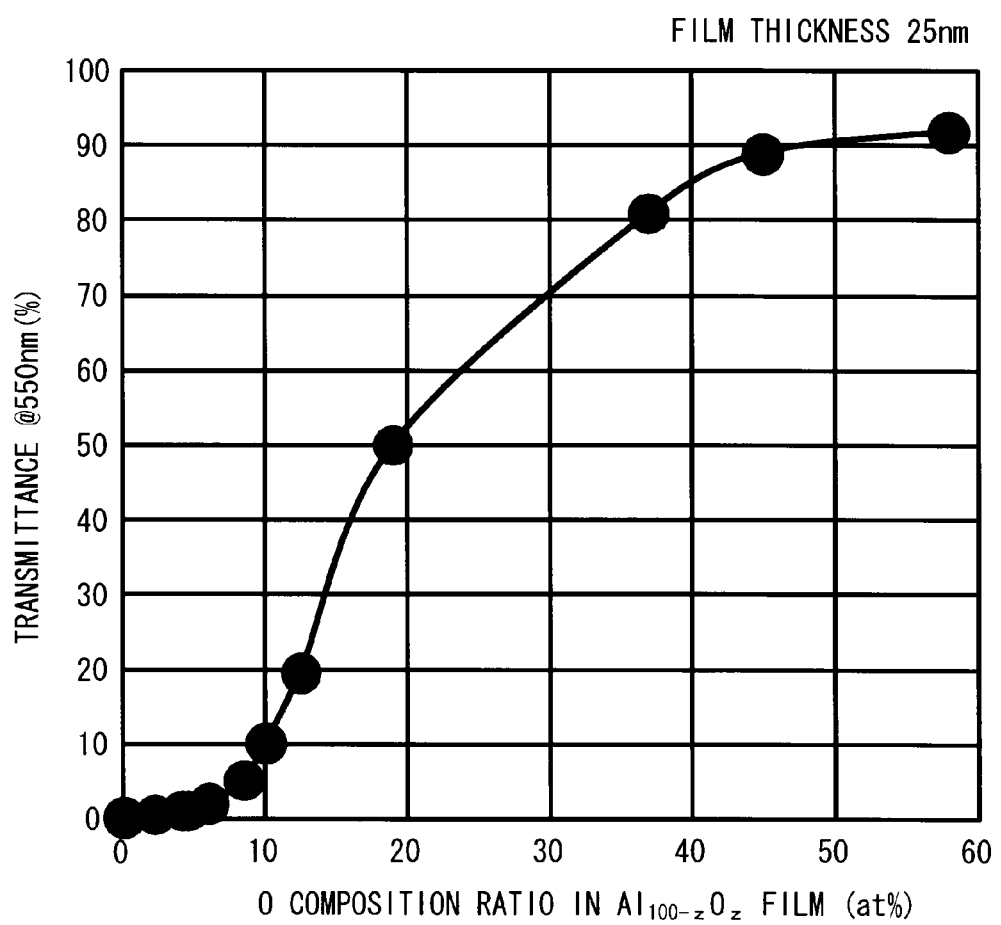
FIG. 25 is a view plotting a transmittance with respect to an O composition ratio (at %) in an $Al_{100-z}O_z$ film.

Although a result when adding an N-element to Al is described above, a light transmittance can be provided also in the case of an $Al_{100-z}O_z$ film in which an O-element is added instead of an N-element, for example. FIG. 25 is a view plotting a transmittance at a wavelength of 550 nm with respect to an O composition ratio (at %) in an $Al_{100-z}O_z$ film. The $Al_{100-z}O_z$ film was formed by sputtering with use of a metal target of pure Al and use of mixed gas in which $O_2$ gas is added to pure Ar gas. The respective $Al_{100-z}O_z$ films having different O composition ratios were deposited with a thickness of 25 nm. The transmittance in FIG. 25 is the transmittance of a film itself, not including the transmittance of the glass substrate 15, which is a transparent insulating substrate.

FIG. 25 shows that a light transmittance appears when an O composition ratio exceeds approximately 10 at %. On the other hand, in the $Al_{100-x}N_x$ film in which an N-element is added, it is necessary that an N composition ratio is at least 40 at % in order that a light transmittance appears as shown in FIG. 24. Thus, a transmittance can be given to an Al film with a smaller added amount of an O-element compared to an N-element.

Figure 26:
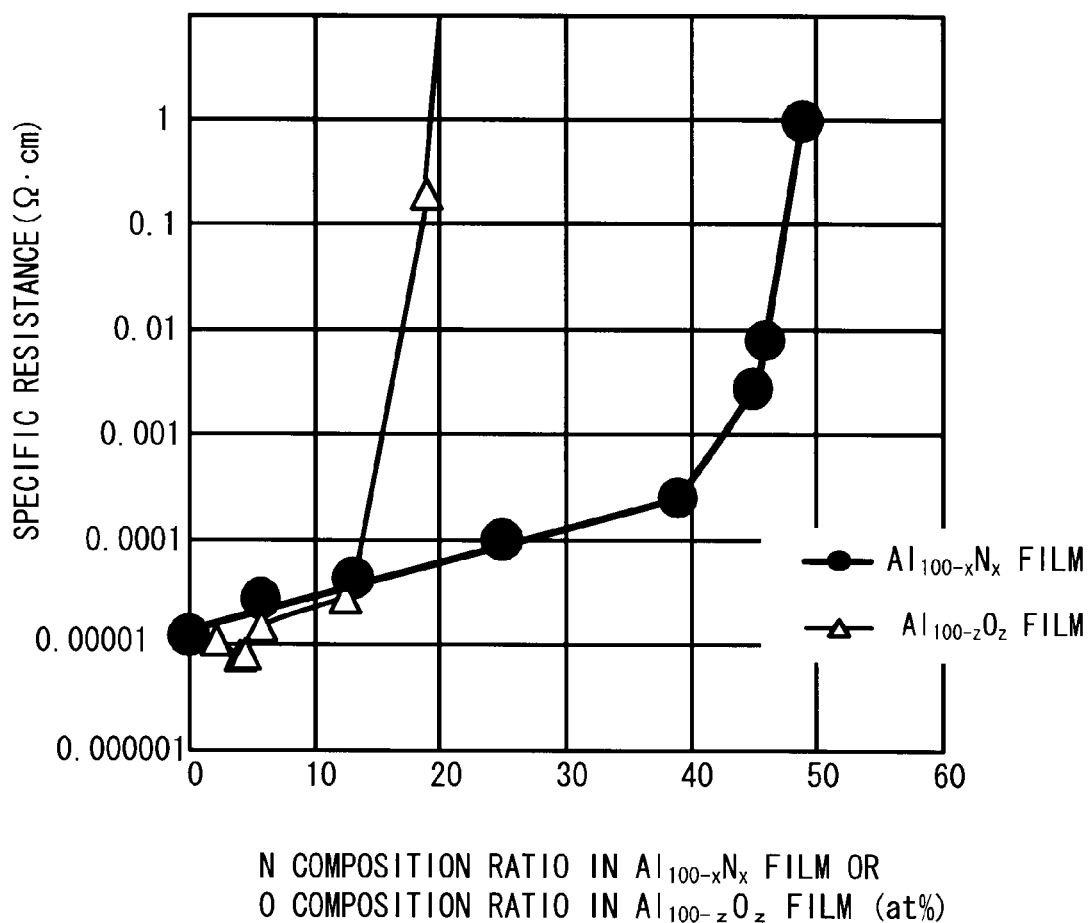
FIG. 26 is a view plotting a specific resistance with respect to an N composition ratio (at %) in an $Al_{100-x}N_x$ film or an O composition ratio (at %) in an $Al_{100-z}O_z$ film.

An $Al_2O_3$ film with a stoichiometric composition ratio of 2:3 (40 at %:60 at %) when an O-element is added to Al is generally called alumina, which is known as an electrical insulator. A specific resistance of the $Al_{100-z}O_z$ film is studied. FIG. 26 is a result of plotting a specific resistance (O·cm) with respect to an N composition ratio or an O composition ratio in each sample of an $Al_{100-x}N_x$ film and an $Al_{100-z}O_z$ film.

As shown in FIG. 26, the specific resistance of the film to which an O-element is added (the $Al_{100-z}O_z$ film) is lower than that of the film to which an N-element is added ($Al_{100-x}N_x$ film) in a region with a composition ratio of less than about 15 at %. On the other hand, the specific resistance of the the $A_{100-z}O_z$ film increases sharply when the O composition ratio exceeds approximately 15 at %. Then, at an O composition ratio of approximately 30 at %, the specific resistance of the $A_{100-z}O_z$ film is at least 10 O·cm, which is outside the conductive region.

Next, an etching rate with respect to an O composition ratio (at %) in an $Al_{100-z}O_z$ film when performing wet etching with use of a known drug solution of phosphoric acid+nitric acid+acetic acid (with a liquid temperature of 40° C.) was studied. The measurement was conducted under the same conditions as those described in the first embodiment shown in FIG. 5.

As a result, it was found that patterning can be performed at an etching rate of about 30 nm/min in the region at an O composition ratio of approximately 10 at %. On the other hand, at an O composition ratio of 11 at % or higher, etching was not substantially made. Thus, if an O composition ratio exceeds 11 at %, it is necessary to perform etching by dry etching. It is not preferable because processing cost increases. From the above result, it is difficult to use a film to which an O-element is added without adding an N-element as a light transmitting film that serves as a first thin film in the antireflection coating 7 according to the seventh embodiment.

In light of the above, use of an Al—N+O film that is on the basis of the Al—N film with an N composition ratio of equal to or hither than 40 at % and lower than 50 at %, which is used in the second embodiment, and that contains an O-element added with a composition ratio of not exceeding 11 at % as a light transmitting Al film that serves as the first thin film is studied hereinbelow.

The Al—N+O film was manufactured using sputtering. For example, the Al—N+O film 7a serving as the first thin film was formed with use of a pure Al metal target and use of Ar gas, which is inert gas, containing $N_2$ gas and $O_2$ gas, at various mixture ratios so as to control an N composition ratio and an O composition ratio. The Al film 7b serving as the second thin film was formed by performing sputtering with use of Ar gas only.

Figure 27:
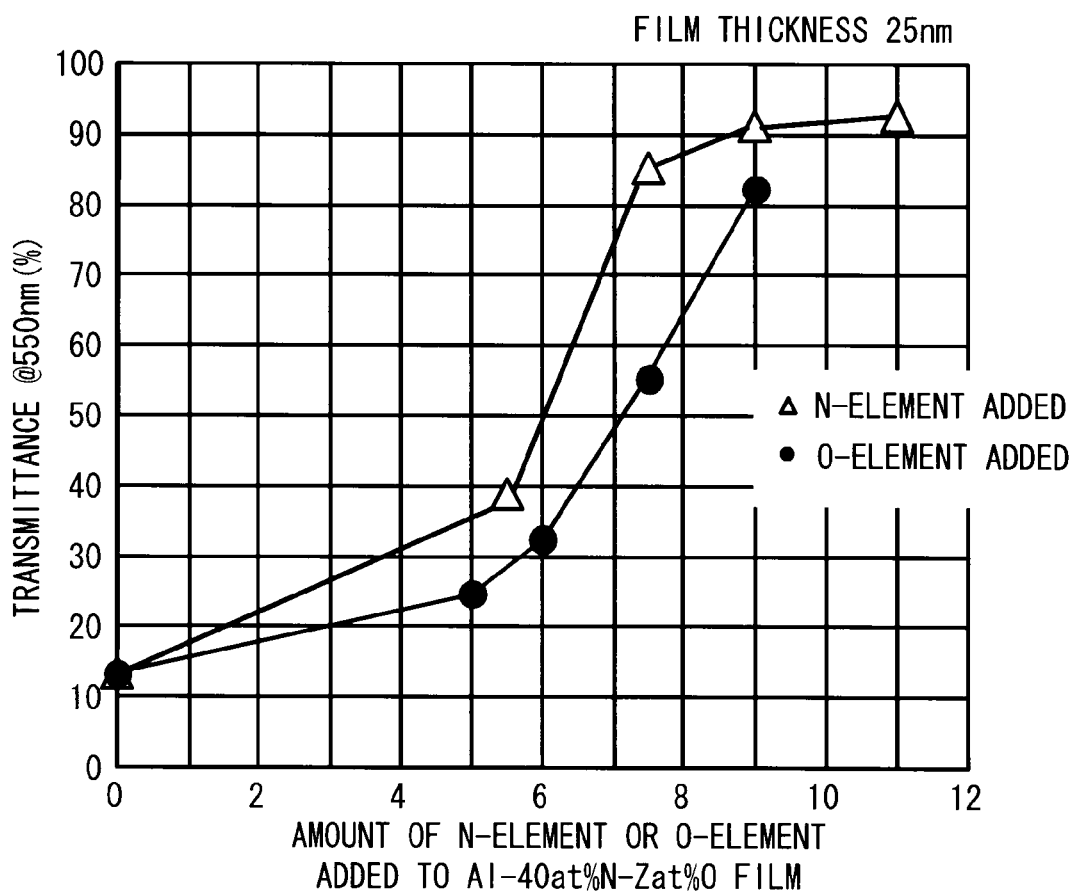
FIG. 27 is a view plotting a transmittance with respect to an N composition ratio or an O composition ratio (at %) in an Al-40 at % N-Z at % O film, which is an Al—N film (Al—N+O film)

FIG. 27 is a result of studying a change in a transmittance at a wavelength of 550 nm of a film on the basis of an Al-40 at % N film (with a thickness of 25 nm), which is the lower limit where a light transmittance appears, when an O-element is gradually added thereto. As a comparative example, FIG. 27 also shows a result when an N-element is gradually added instead of the O-element.

FIG. 27 shows that a transmittance of a film becomes higher by addition of the O-element than by addition of the N-element if the added amount is the same. However, if an O composition ratio exceeds 11 at %, a specific resistance exceeds 10 O·cm, which is no longer the conductive region, and wet etching with use of a known drug solution of phosphoric acid+nitric acid+acetic acid (at a liquid temperature of 40° C.) becomes difficult as described above. It is thus preferred to add the O-element at a composition ratio of less than 11 at %.

Figure 28:
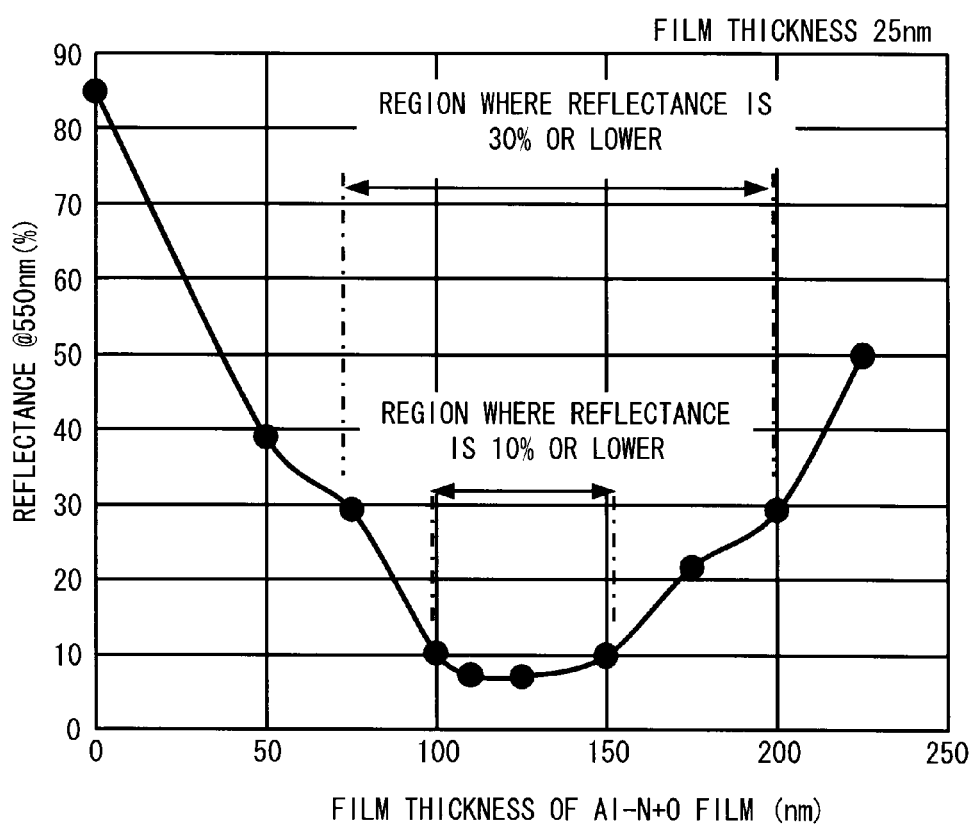
FIG. 28 is a view plotting a reflectance of an antireflection coating with respect to a film thickness of an Al—N film (Al—N+O film).

A result of studying an optimum film thickness of the Al—N+O film 7a that serves as the first thin film of the antireflection coating 7 is described hereinafter. FIG. 28 is a view plotting a reflectance of a laminated film of an Al—N+O film serving as the first thin film and an Al film serving as the second thin film with respect to the film thickness of the Al—N+O film. The thickness of the Al film, which is a pure Al film, was fixed to 200 nm, and the thickness of the Al—N+O film varied in the range of 50 to 250 nm, and the optimum film thickness was studied. A sample was obtained by depositing an Al-40 at % N-9 at % O film as the Al—N+O film on the transparent insulating glass substrate 15 (n=1.5) with a thickness of 0.6 mm and further depositing a pure Al film as the Al film thereon. The reflectance is a measured value at a wavelength of 550 nm, which is measured from the glass substrate side.

A refractive index n of the Al-40 at % N-9 at % O film that is the Al—N+O film serving as the first thin film was 2.20, and a refractive index n of the Al film serving as the second thin film was 1.10. The two laminated films were etched all together at a time with use of a known drug solution of phosphoric acid+nitric acid+acetic acid.

FIG. 28 shows that a reflectance varies depending on the thickness of the Al—N+O film 7a, which is the first thin film. It is also shown that a reflectance becomes 30% or lower if the thickness of the Al—N+O film 7a is limited to the range of 70 nm to 200 nm. Further, a reflectance becomes 10% or lower if the thickness of the Al—N+O film 7a is limited to the range of 100 nm to 150 nm. The Al—N+O film 7a where a reflectance is 10% or lower (with a thickness of 100 nm to 150 nm) was a so-called black film.

Hereinafter, a reflectance of the antireflection coating 7 according to the seventh embodiment shown in FIG. 28 and a reflectance of the antireflection coating 2 according to the second embodiment shown in FIG. 13 are studied in comparison. The range of the film thickness of the first thin film where a reflectance is 30% or lower is 40 to 95 nm in the second embodiment. On the other hand, it is 70 to 200 nm in the seventh embodiment, and the film thickness range is larger than that of the second embodiment. Likewise, the range of the film thickness of the first thin film where a reflectance is 10% or lower, which is a so-called black film, is 60 to 80 nm in the second embodiment. On the other hand, it is 100 to 150 nm in the seventh embodiment, and the film thickness range is larger than that of the second embodiment.

Thus, the seventh embodiment that uses the Al—N+O film 7a as the first thin film allows a larger margin of the thickness of the first thin film than the second embodiment that uses the Al—N film 2a in which an N-element is added without adding an O-element. This is because further addition of an O-element to the Al—N film enables an increase in transmittance as shown in FIG. 27 and thereby promotes more effective functioning of the first thin film that functions as a light interference film of the antireflection coating.

The specific resistance of the antireflection coating 7 according to the seventh embodiment is determined by the characteristics of the pure Al film used as the Al film 7b, and it is $3.5 \times 10^{-6}$ O·cm. The antireflection coating 7 thus has good conductive property that is substantially equal to that of the antireflection coating 2 according to the second embodiment having the same structure.

Although the thickness of the Al film 7b according to the seventh embodiment was fixed to 200 nm in the above example, the present invention is not limited thereto, and it may be selected arbitrarily depending on a required electrode (line) resistance. Further, the Al film 7b is not limited to the pure Al film, and an arbitrary element may be added to Al in consideration of heat resistance, corrosion resistance or the like. Further, if an element selected from a group 8 transition metal element is added, it is possible to realize suitable contact characteristics with a transparent conductive oxide film such as ITO, which has been difficult, as described in the second embodiment. Particularly, if at least one kind of element selected from Fe, Ni and Co is added, it is possible to reduce a specific resistance more effectively. This enables suitable use as a black matrix for a color filter substrate which is electrically connected to a transparent conductive film such as ITO. Further, if a film having a specific resistance of lower than $2.5 \times 10^{-5}$ O·cm is used, it is possible to realize an antireflection coating having a lower specific resistance than that of an Mo or Cr film (with a specific resistance of $2.5 \times 10^{-5}$ O·cm), which is a known antireflection coating, thus being preferable.

Further, although the Al-40 at % N-9 at % O film was used as the light transmitting Al—N+O film 7a that functions as the first thin film in the example of the seventh embodiment, the present invention is not limited to such a composition ratio. It is preferred to use an Al—N+O film that combines an N composition ratio in the range of equal to or higher than 40 at % and lower than 50 at %, which provides light transmitting property (a transmittance of 10% or higher at a film thickness of 25 nm) and conductive property, and an O composition ratio in the range of not exceeding 11 at %, which is the conductive region. The film thickness may be set appropriately according to a required reflectance.

Because the antireflection coating 7 according to the seventh embodiment uses Al metal having low electric resistance characteristics as a base, patterning is easy and a highly accurate pattern can be obtained. Further, by using high light transmitting property of the Al—N+O film 7a that serves as the first thin film of the antireflection coating 7 and setting an appropriate film thickness, it is possible to achieve low reflection characteristics.

Further, the manufacturing method of the antireflection coating 7 according to the seventh embodiment can employ a known technique such as sputtering, and it is thus possible to use an existing facility without need of a special manufacturing device. This enables cost reduction. Although the case where the antireflection coating has the two-layer structure of the Al—N+O film 7a and the Al film 7b is described in the seventh embodiment, the same advantage as the seventh embodiment can be obtained by a film in which a content of N and O decreases with a distance from the glass substrate 15.

The antireflection coating 7 according to the seventh embodiment is not limited to be the two-layer laminated film, and an antireflection coating having the three-layer structure as shown in FIG. 14 according to the third embodiment may be applied. In this case, low reflection characteristics can be achieved on both of the glass substrate side and the upper layer film side.

Further, the antireflection coating 7 according to the seventh embodiment may be applied suitably to a black matrix film, a light blocking film, a wiring and electrode film and or the like a liquid crystal display device as in the fourth to sixth embodiments described above.

Although the case where the antireflection coating according to an embodiment of the present invention is applied to a black matrix film, a light blocking film, a wiring and electrode film or the like of a liquid crystal display device is described in the fourth to sixth embodiments, the present invention is not limited thereto, and it may be widely applied to elements that require low electric resistance characteristics and low reflection characteristics. For example, it may be applied suitably to a wiring film for a touch panel sensor or the like. Further, the present invention is not limited to an example of a liquid crystal display device, and it may be suitably applied to various devices such as a display device in need of an antireflection coating that requires low electric resistance characteristics and low reflection characteristics. Furthermore, because a black film can be easily obtained by setting conditions as described above, it is suitably applicable to various devices where a black film is necessary in addition to the above characteristics. Particularly, a significant advantage can be obtained if low electric resistance characteristics are required for the antireflection coating.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An antireflection coating formed on a transparent substrate, comprising:
   an Al film having a transmittance of lower than 10% at a wavelength of 550 nm with a thickness of 25 nm, the Al film predominantly composed of aluminum (Al); and
   an Al—N film formed in at least one of an upper layer and a lower layer of the Al film and having a transmittance of equal to or higher than 10% at a wavelength of 550 nm when measured at a thickness of 25 nm, the Al—N film predominantly composed of Al and comprising a nitrogen (N) element as an additive, wherein
   a specific resistance of the antireflection coating is equal to or lower than $1.0 \times 10^{-2}$ $\Omega \cdot$cm, and
   a reflectance of a surface of the Al—N film is equal to or lower than 50% in a visible light region.

2. The antireflection coating according to claim 1, wherein the Al film at least includes a film with a specific resistance of equal to or lower than $2.5 \times 10^{-5}$ $\Omega \cdot$cm.

3. The antireflection coating according to claim 1, wherein a specific resistance of the Al—N film is equal to or higher than $2.5 \times 10^{-4}$ $\Omega \cdot$cm.

4. The antireflection coating according to claim 1, wherein a specific resistance of the Al—N film is lower than 10 $\Omega \cdot$cm.

5. The antireflection coating according to claim 1, wherein a composition ratio of the N-element in the Al—N film is equal to or higher than 40 at % and lower than 50 at %.

6. The antireflection coating according to claim 1, wherein at least one of the Al film and the Al—N film further comprises at least one kind of element selected from a group 8 transition metal element as the additive.

7. The antireflection coating according to claim 1, wherein a thickness of the Al—N film is equal to or larger than 40 nm and equal to or smaller than 95 nm.

8. The antireflection coating according to claim 1, wherein the Al—N film further comprises an oxygen (O) element as the additive.

9. The antireflection coating according to claim 8, wherein a composition ratio of the O-element in the Al—N film is lower than 11 at %.

10. The antireflection coating according to claim 8, wherein a thickness of the Al—N film is equal to or larger than 70 nm and equal to or smaller than 200 nm.

11. An antireflection coating formed on a transparent substrate, wherein
   the antireflection coating is predominantly composed of aluminum (Al) and at least contains a nitrogen (N) element as an additive,
   a composition ratio of the N-element is equal to or higher than 30 at %, and
   a specific resistance is equal to or lower than $1.0 \times 10^{-2}$ $\Omega \cdot$cm.

12. The antireflection coating according to claim 11, wherein a composition ratio of the N-element is equal to or lower than 45 at %.

13. The antireflection coating according to claim 11, further comprising at least one group 8 transition metal element as the additive.

14. A display device comprising:
   an antireflection coating formed on a transparent substrate, the antireflection coating comprising:
   an Al film having a transmittance of lower than 10% at a wavelength of 550 nm with a thickness of 25 nm, the Al film predominantly composed of aluminum (Al), and
   an Al—N film formed in at least one of an upper layer and a lower layer of the Al film and having a transmittance of equal to or higher than 10% at a wavelength of 550 nm when measured at a thickness of 25 nm, the Al—N film predominantly composed of Al and comprising a nitrogen (N) element as an additive, wherein
   a specific resistance of the antireflection coating is equal to or lower than $1.0 \times 10^{-2}$ $\Omega \cdot$cm, and
   a reflectance of a surface of the Al—N film is equal to or lower than 50% in a visible light region.

15. The display device according to claim 14, wherein at least a part of the antireflection coating is in direct contact with and electrically connected to an electrode made of a transparent conductive film.

16. The display device according to claim 14, wherein the Al—N film further comprises oxygen (O) element as the additive.

* * * * *